(12) United States Patent
Kim

(10) Patent No.: US 6,862,052 B2
(45) Date of Patent: Mar. 1, 2005

(54) LIQUID CRYSTAL DISPLAY, THIN FILM TRANSISTOR ARRAY PANEL FOR LIQUID CRYSTAL DISPLAY AND MANUFACTURING METHOD THEREOF

(75) Inventor: Dong-Gyu Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 10/147,345

(22) Filed: May 16, 2002

(65) Prior Publication Data

US 2003/0112383 A1 Jun. 19, 2003

(30) Foreign Application Priority Data

Dec. 14, 2001 (KR) ......................................... 2001-79331

(51) Int. Cl.[7] .......................................... G02F 1/1343
(52) U.S. Cl. ............................. 349/54; 349/42; 349/48; 349/139
(58) Field of Search ............................. 349/41, 42, 48, 349/54, 55, 139, 192

(56) References Cited

U.S. PATENT DOCUMENTS

| | | | | |
|---|---|---|---|---|
| 4,368,523 A | * | 1/1983 | Kawate ........................ | 365/63 |
| 5,173,792 A | * | 12/1992 | Matsueda ..................... | 349/54 |
| 5,825,438 A | * | 10/1998 | Song et al. ................... | 349/54 |
| 5,835,177 A | * | 11/1998 | Dohjo et al. ................. | 349/147 |
| 6,340,998 B1 | * | 1/2002 | Kim et al. .................... | 349/48 |
| 6,411,346 B1 | * | 6/2002 | Numano et al. .............. | 349/39 |
| 6,462,798 B1 | * | 10/2002 | Kim et al. .................... | 349/129 |
| 6,654,090 B1 | * | 11/2003 | Kim et al. .................... | 349/129 |
| 2003/0202146 A1 | * | 10/2003 | Takeda et al. ............... | 349/129 |

* cited by examiner

Primary Examiner—Tarifur R. Chowdhury
Assistant Examiner—Andrew Schechter
(74) Attorney, Agent, or Firm—F. Chau & Associates LLC

(57) ABSTRACT

A gate wire is formed on the insulating substrate. The gate wire has gate lines, first and second gate electrodes connected to the gate lines, and gate pads. A gate insulating layer, first and second semiconductor layers and an ohmic contact layer are sequentially formed thereon. A data wire is formed on the ohmic contact layer. The data wire has first and second data lines, data line connectors, first and second source electrodes, first and second drain electrodes, and data pads. A passivation layer is formed on the data wire, and has contact holes respectively exposing the first and the second drain electrodes, and the gate and the data pads. Pixel electrodes, and subsidiary gate and data pads are formed on the passivation layer. As described above, the data line is provided at opposite sides of the pixel area so that variation in the pixel voltage due to the parasitic capacitance between the partitioned areas with different degree of misalignment is reduced. In addition, two TFTs are provided in each pixel area so that the parasitic capacitance between the gate and the drain electrodes in two respective partitioned areas with left-biased and right-biased misalignment is kept to be constant. In this way, the pixel voltage variation between the two partitioned areas is reduced to prevent non-uniformity in the brightness.

19 Claims, 38 Drawing Sheets

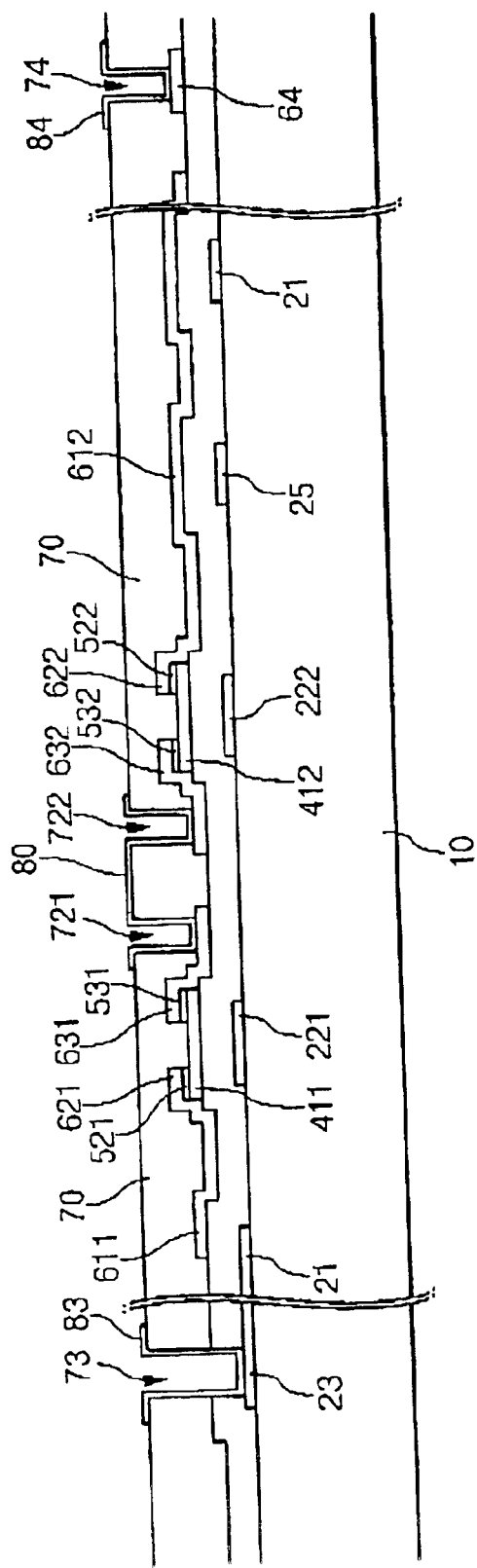

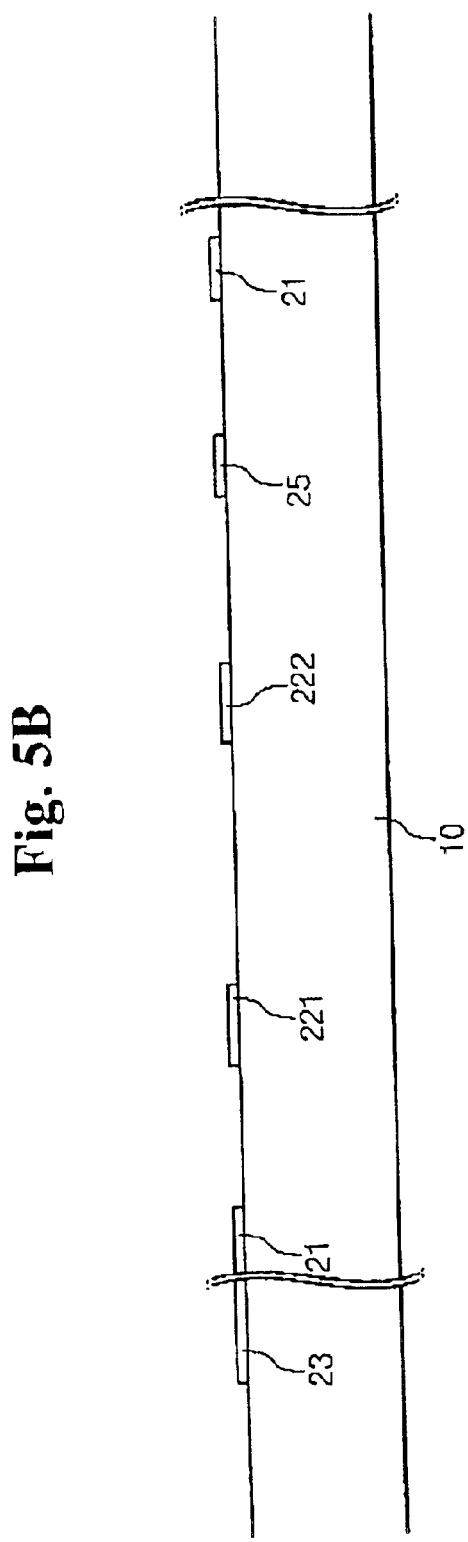

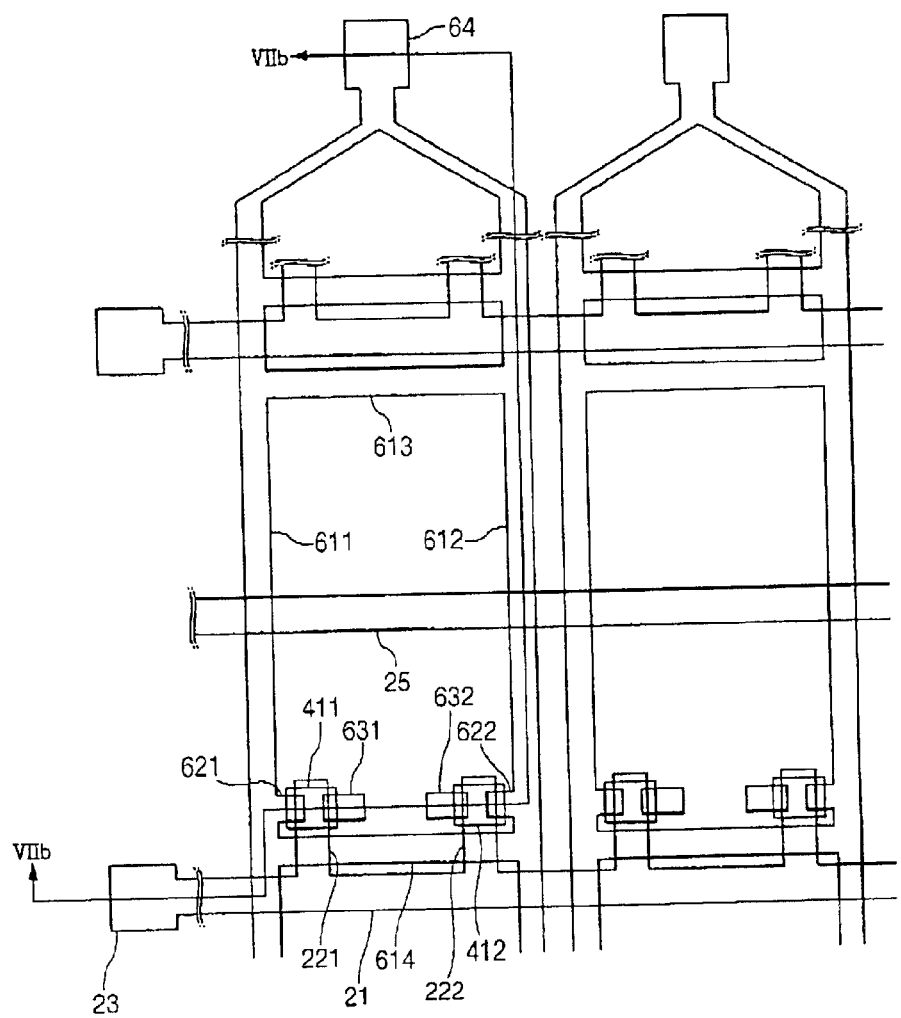

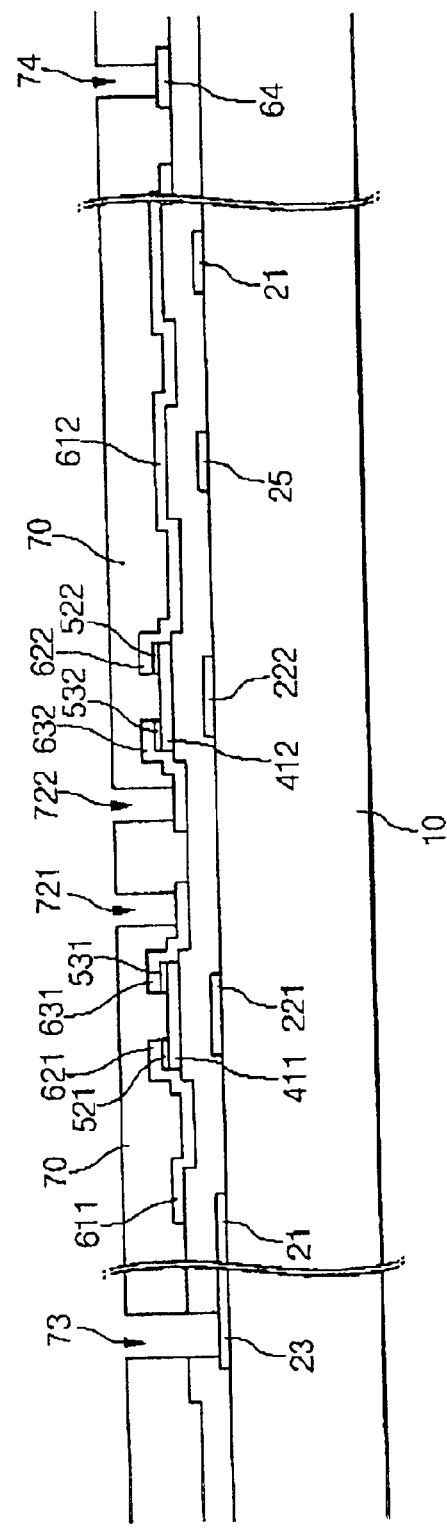

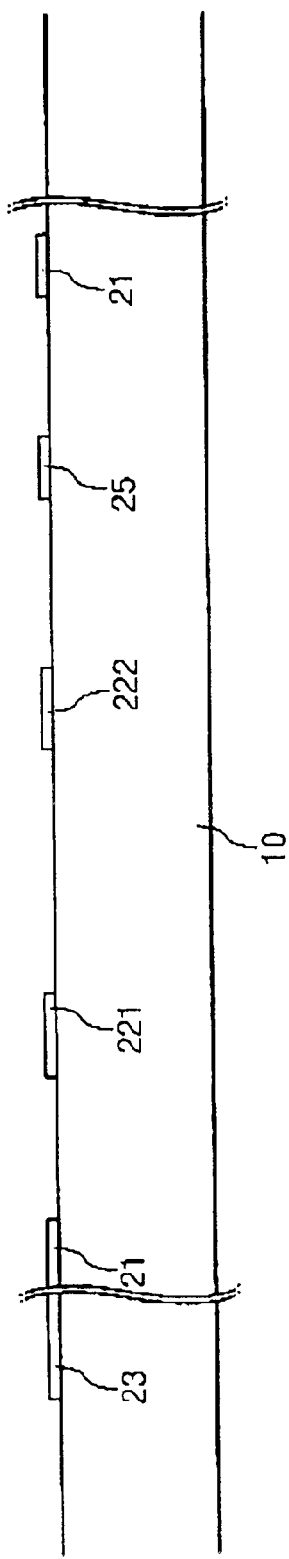

US 6,862,052 B2

LIQUID CRYSTAL DISPLAY, THIN FILM TRANSISTOR ARRAY PANEL FOR LIQUID CRYSTAL DISPLAY AND MANUFACTURING METHOD THEREOF

BACKGROUND OF THE INVENTION (a) Field of the Invention

The present invention relates to a thin film transistor array panel for a liquid crystal display, and a method of manufacturing the same.

(b) Description of the Related Art

Generally, a liquid crystal display ("LCD") is one of the most widely used flat panel displays. The LCD has two glass substrates with electrodes formed thereon, and a liquid crystal layer interposed between the two substrates. Voltages are applied to the electrodes to re-orient liquid crystal molecules in the liquid crystal layer, thereby controlling the transmittance of light.

One of panels of an LCD has thin film transistors ("TFTs") for switching the voltages applied to the electrodes, and is called the "TFT array panel." In addition to the TFTs, the TFT array panel has signal lines including gate lines and data lines, and gate pads and data pads for transmitting signals to the gate and the data lines after receiving the signals from an external source. A plurality of pixel electrodes are formed at pixel areas defined by the intersections of the gate lines and the data lines such that they are electrically connected to the TFTs.

In order to enhance the charge storage capacity of pixels, a storage capacitor is provided at the LCD by way of a previous gate type or a separate wire type.

The previous gate type forms a storage capacitor by overlapping a pixel electrode with a neighboring gate line while interposing an insulating layer therebetween. By contrast, the separate wire type forms a storage capacitor by overlapping a pixel electrode with a separate storage electrode line while interposing an insulating layer therebetween. The separate wire type has an advantage that it reduces the signal delay of a 30–40 inch wide screen LCD.

Meanwhile, several photolithography steps are required for manufacturing a wide screen LCD. The substrate is partitioned into two or more areas, which are exposed to light in turn, and the degree of misalignment is different between the partitioned areas after the completion of the light exposure. Therefore, the brightness distribution is non-uniform between the partitioned areas and it is resulted from two reasons. The first reason is the distance difference between the data line and the pixel electrode in the respective partitioned areas due to the misalignment. For example, a pixel voltage of a pixel in a partitioned area with a pixel electrode closer to the right data line is different from that of a pixel in another partitioned area with a pixel electrode closer to the left data line. The second reason is the difference of parasitic capacitance generated between the gate electrode and the drain electrode in the respective partitioned areas due to the misalignment. The parasitic capacitance in a partitioned area with the closely spaced gate and drain electrodes is different from that in a partitioned area with the distantly spaced gate and drain electrodes, and the difference causes the kick-back voltage difference and thus the pixel voltage difference.

SUMMARY OF THE INVENTION

It is an object of the present invention to prevent non-uniformity in the brightness between the respective partitioned areas.

This object may be achieved by forming two data lines applied with the same signal in a pixel area.

According to the present invention, a gate wire including gate lines, and first and second gate electrodes connected to the gate lines and spaced apart from each other by a predetermined distance is formed on an insulating substrate, and a gate insulating layer is formed thereon. First and second semiconductor layers are formed on the gate insulating layer, and a data wire is formed thereon. The data wire includes first and second data lines intersecting the gate lines to define pixel areas and spaced apart from each other by a predetermined distance, first and second source electrodes which are respective parts of the first and the second data lines, and first and second drain electrodes respectively facing the first and the second source electrodes. A passivation layer with first and second contact holes respectively exposing the first and the second drain electrodes is formed, and a pixel electrode connected to the first and the second drain electrodes are formed.

It is preferable that the first and the second data lines are applied with the same signal.

The data wire may further include data line connectors, respectively formed at the upper and the lower half parts of the pixel area, to interconnect the first and the second data lines. A storage electrode line parallel to the gate lines may be formed of the same layer as the gate lines.

The first and the second semiconductor layers and the data wire may have the same planar shape except for areas between the first source electrode and the first drain electrode and between the second source electrode and the second drain electrode.

Ohmic contact layers may be formed between the first and second semiconductor layers and the data wire. The ohmic contact layers and the data wire may have the same planar shape.

The gate wire may further include gate pads for applying signals to the gate lines. The data wire may further include data pads for applying signals to the data lines. The passivation layer may further have third and fourth contact holes respectively exposing the gate and the data pads. Subsidiary gate and data pads connected to the gate and the data pads through the third and the fourth contact holes, respectively, may be formed of the same layer as the pixel electrode.

In a method of manufacturing a TFT array panel according to the present invention, a gate wire including gate lines, and first and second gate electrodes connected to the gate lines and spaced apart from each other by a predetermined distance is first formed on an insulating substrate. A gate insulating layer and first and second semiconductor layers are formed. A data wire is formed, the data wire including first and second data lines intersecting the gate lines to define pixel areas and spaced apart from each other by a predetermined distance, first and second source electrodes which are respective parts of the first and the second data lines, and first and second drain electrodes respectively facing the first and the second source electrodes. A passivation layer with first and second contact holes respectively exposing the first and the second drain electrodes is then formed, and a pixel electrode connected to the first and the second drain electrodes is formed.

A data line connector interconnecting the first and the second data lines may be formed during the formation of the data wire. A storage electrode line parallel to the gate lines may be formed during the formation of the gate wire.

The semiconductor layers and the data wire may be formed together by photolithograph using a photoresist pattern with position-dependent thickness. It is preferable that the photoresist pattern has a first portion with a first thickness, a second portion with a thickness larger than the first thickness, and a third portion with no thickness. It is preferable that the photoresist pattern is formed using a photo mask with a first region, a second region bearing a light transmittance lower than the first region and a third region bearing a light transmittance higher than the first region in such a way that the first to the third regions of the mask correspond to the first to the third portions of the photoresist pattern, respectively. It is desirable that the first portion is placed between the source and the drain electrodes, the second portion is placed in a place where the data wire will be formed, and the third portion is placed in the remaining area. A semitransparent film or a slit pattern with a slit width smaller than light resolution of a light exposer may be formed at the photo mask to adjust the light transmittance of the first to the third regions in a different manner.

An ohmic contact layer may be formed between the semiconductor layer and the data wire. The semiconductor layer, the ohmic contact layer and the data wire may be formed by one photolithography process.

the gate wire may further include gate pads for applying signals to the gate lines, the data wire may further include data pads for applying signals to the data lines, and the passivation layer may further has third and fourth contact holes respectively exposing the gate and the data pads. Subsidiary gate and data pads made of the same layer as the pixel electrode and connected to the gate and the data pads through the third and the fourth contact holes, respectively, may be formed.

In the present invention, the data line is provided at opposite sides of the pixel area so that variation in the pixel voltage due to the parasitic capacitance between the partitioned areas with different degree of misalignment is reduced. In addition, two TFTs are provided in each pixel area so that the parasitic capacitance between the gate and the drain electrodes in two respective partitioned areas with left-biased and right-biased misalignment is kept to be constant. In this way, the pixel voltage variation between the two partitioned areas is reduced to prevent non-uniformity in the brightness.

BRIEF DESCRIPTION OF THE DRAWINGS

FIG. 2 is a sectional view taken along the line II—II of FIG. 1;

FIG. 5B is a sectional view taken along the Vb—Vb line of FIG. 5A;

FIG. 7A is a layout view illustrating the step following the step illustrated in FIG. 6A;

FIG. 8B is a sectional view taken along the line VIIIb—VIIIb of FIG. 8A;

FIG. 11B is a sectional view taken along the line XIb—XIb of FIG. 11A;

DETAILED DESCRIPTION OF PREFERRED EMBODIMENTS

TFT array panels for LCDs and manufacturing methods thereof according to embodiments of the present invention will be now described in detail so that those skilled in the art easily carry out with reference to accompanying drawings.

First, the structure of a TFT array panel for an LCD according to a first embodiment will be described in detail with reference to FIGS. 1 and 2.

Figure 1:
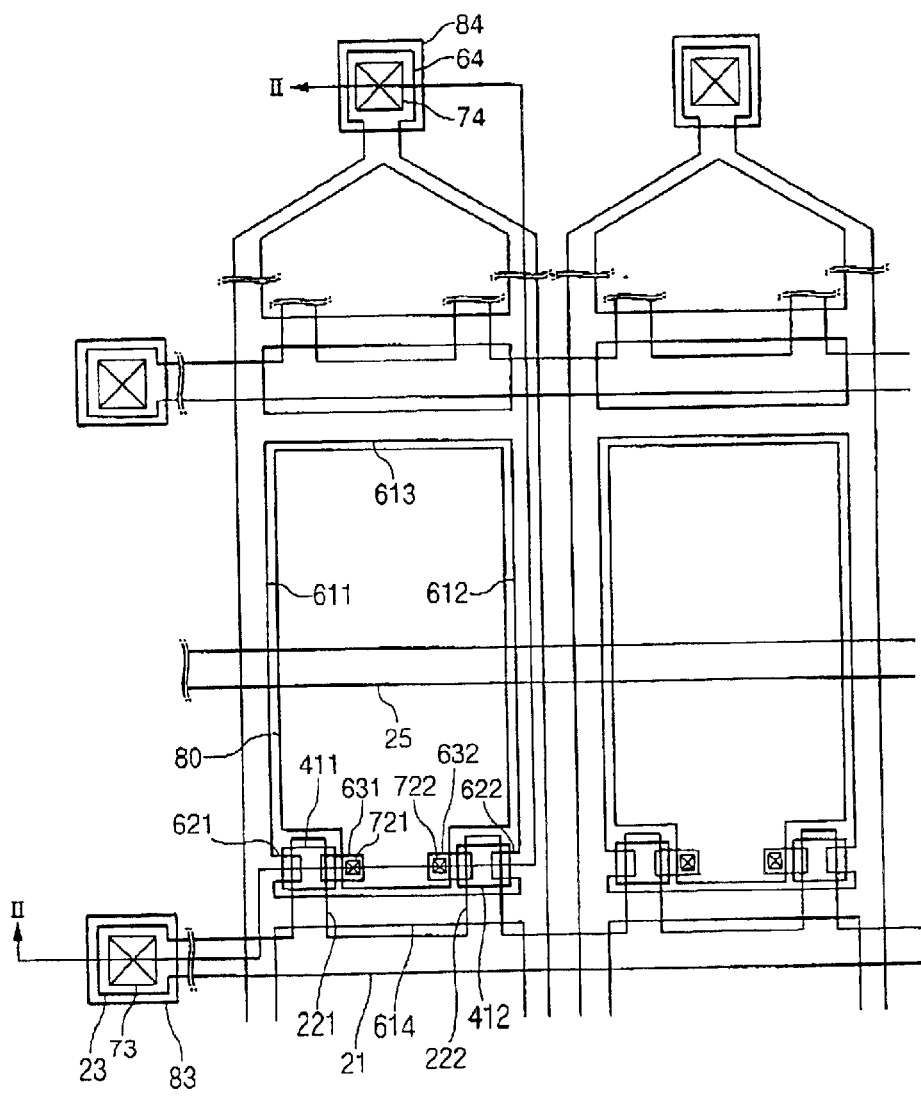
FIG. 1 is a layout view of a TFT array panel for an LCD according to a first embodiment of the present invention.

FIG. 1 is a layout view of a TFT array panel for an LCD according to a first embodiment of the present invention, and FIG. 2 is a sectional view taken along the line II—II in FIG. 1.

As shown in FIGS. 1 and 2, a gate wire 21, 221, 222 and 23 and a storage electrode line 25 are formed on an insulating substrate 10. The gate wire 21, 221, 222 and 23 and the storage electrode line 25 are made of metallic or conductive material such as aluminum (Al) or Al alloy, molybdenum (Mo) or molybdenum-tungsten alloy (MoW), chromium (Cr) and tantalum (Ta). The gate wire includes a plurality of gate lines 21 extending in a transverse direction, first and second gate electrodes 221 and 222 which are parts of the gate lines 21 and spaced apart from each other with a predetermined distance, and a plurality of gate pads 23 which are connected to ends of the gate lines 21 and receive scanning signals from an external source to transmit to the gate lines 21. The storage electrode line 25 is placed between the gate lines 21 while extending parallel thereto, and overlaps pixel electrodes 80 while interposing insulating layers 30 and 70 (which will be described later), thereby forming storage capacitors.

The gate wire 21, 221, 222 and 23 and the storage electrode line 25 may have a single-layered structure, a double-layered structure or a triple-layered structure. In the case of the multiple-layered structure, one layer is made of a low resistance material, and the other layer is made of a material bearing a good contact characteristic with other materials. For instance, Cr/Al (or Al alloy), or Al (or Al alloy)/Mo may be used for that purpose.

The gate wire 21, 221, 222 and 23 and the storage electrode line 25 are covered by a gate insulating layer 30 preferably made of silicon nitride (SiNx).

A first semiconductor layer 411 in an island shape preferably made of amorphous silicon is formed on the gate insulating layer 30 opposite the first gate electrode 221. An ohmic contact layer 521 and 531 preferably made of amorphous silicon doped with n-type impurities such as phosphorous P is formed on the first semiconductor layer 411, and separated into two portions with respect to the first gate electrode 221. Meanwhile, a second semiconductor layer 412 in an island shape is formed on the gate insulating layer 30 opposite the second gate electrode 222. An ohmic contact layer 522 and 532 is formed on the second semiconductor layer 412 and separated into two portions with respect to the second gate electrode 222.

A data wire 611–614, 621, 622, 631, 632 and 64 is formed on the ohmic contact layers 521, 531, 522 and 532 and the gate insulating layer 30. The data wire 611–614, 621, 622, 631, 632 and 64 is made of metallic or conductive material such as Al or Al alloy, Mo or MoW alloy, Cr or Ta. The data wire includes first and second data lines 611 and 612 which extend in the longitudinal direction and are spaced apart from each other. The first and the second data lines 611 and 612 intersect the gate lines 21 to thereby define pixel areas. The data wire further includes a plurality of data line connectors 613 and 614, adjacent to the gate lines 21, for interconnecting the first and the second data lines 611 and 612. The data wire further includes first source electrodes 621 which are portions of the first data lines 611, first drain electrodes 631 opposite the first source electrodes 621 with respect to the first gate electrodes 221, second source electrodes 622 which are portions of the second data lines 612, second drain electrodes 632 opposite the second source electrodes 622 with respect to the second gate electrodes 222, and data pads 64 connected to the first and the second data lines 611 and 612 to receive image signals from an external source and transmit them to the first and the second data lines 611 and 612.

The data wire 611–614, 621, 622, 631, 632 and 64 may have a single-layered structure, a double-layered structure or a triple-layered structure. In the case of the multiple-layered structure, one layer is made of a low resistance material, and the other layer is made of a material bearing a good contact characteristic with other materials.

The first gate electrode 221, the first semiconductor layer 411, the first source electrode 621 and the first drain electrode 631 form a first TFT, while the second gate electrode 222, the second semiconductor layer 412, the second source electrode 622 and the second drain electrode 632 form a second TFT.

A passivation layer 70 preferably made of silicon nitride is formed on the data wire 611–614, 621, 622, 631, 632 and 64 and the gate insulating layer 30 with silicon nitride. The passivation layer 70 has a contact hole 73 exposing the gate pad 23 together with the gate insulating layer 30, and a contact hole 74 exposing the data pad 64. Furthermore, the passivation layer 70 has contact holes 721 and 722 exposing the first and the second drain electrodes 631 and 632.

Pixel electrodes 80, subsidiary gate pads 83 and subsidiary data pads 84 preferably made of a transparent conductive material such as indium tin oxide (ITO) and indium zinc oxide (IZO) are formed on the passivation layer 70.

The pixel electrodes 80 are connected to the first and the second drain electrodes 631 and 632 through the contact holes 721 and 722 to receive image signals. The subsidiary gate and data pads 83 and 84 are connected to the gate and the data pads 23 and 64 through the contact holes 73 and 74, respectively. The subsidiary gate and data pads 83 and 84 make a function of reinforcing the adhesiveness between the pads 23 and 64 and external circuits as well as protecting the pads 23 and 64.

When the TFT array panel is manufactured using a partitioned light exposing technique, the non-uniformity in the brightness between partitioned areas due to the difference in the distance between the pixel electrode and the data line in the respective partitioned areas can be prevented, which will be described in detail with reference to FIGS. 3A-4B. For convenience of description, FIGS. 3A-4B show only a few necessary elements.

First, non-uniformity in the brightness between the partitioned areas of a conventional TFT array panel is described.

Figure 3A:
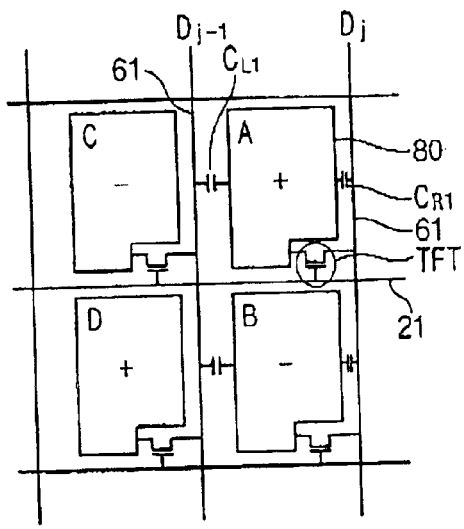
FIGS. 3A and 3B illustrate non-uniformity in the brightness between the partitioned areas in a conventional TFT array panel.
Figure 3B:
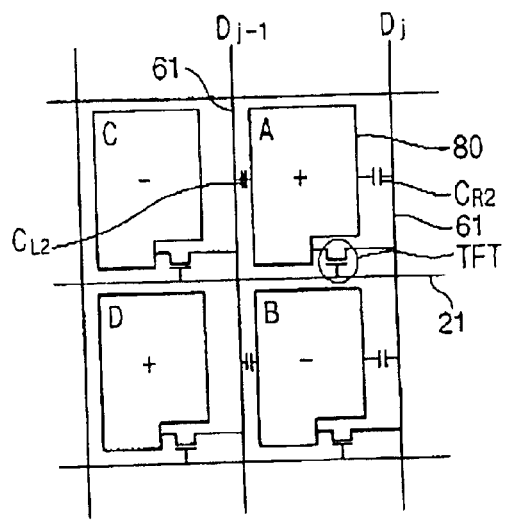
Figure 3C:
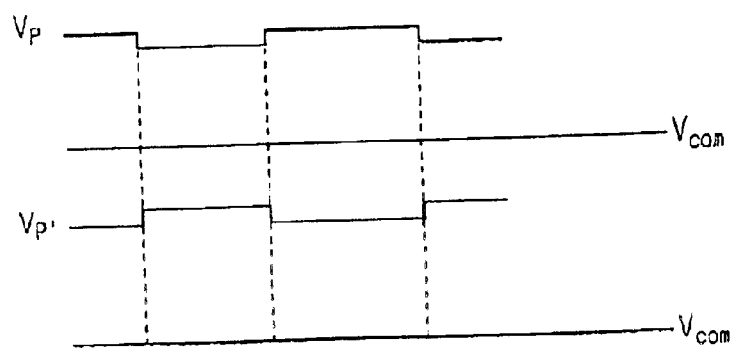
FIG. 3C illustrates the change of pixel voltage in FIGS. 3A and 3B.

FIG. 3A illustrates the case where a data line is biased to the left side with respect to a pixel electrode due to the misalignment of the mask, FIG. 3B illustrates the case where a data line is biased to the right side with respect to a pixel electrode, and FIG. 3C illustrates variation in pixel voltages in FIGS. 3A and 3B.

As shown in FIGS. 3A and 3B, pixel areas are defined by the intersections of gate lines 21 and data lines 61. A pixel electrode 80 is formed in each pixel area. The gate line 21, the data line 61 and the pixel electrode 80 are connected to a TFT. In this configuration, a pixel voltage is applied to the pixel electrode 80 by way of the operation of the TFT upon receipt of the gate and the data signals from the gate and the data lines 21 and 61, respectively.

As shown in FIG. 3A, in a partitioned area where the pixel electrode 80 is positioned closer to the right-sided data line 61, since the distance between the pixel electrode 80 and the data line $D_j$ is shorter than the distance between the pixel electrode 80 and the data line $D_{j-1}$, the parasitic capacitance of $C_{R1}$ is greater than that of $C_{L1}$. After the pixel voltage in the pixel area A becomes positive with respect to a common voltage, a reference voltage, the data line $D_j$ is changed from a positive state to a negative state to charge the next pixel row. After the pixel voltage in the pixel area C becomes negative with respect to the common voltage, the reference voltage, the data line $D_{j-1}$ is changed from a negative state to a positive state to charge the next pixel row. Consequently, the pixel voltage in the pixel area A is varied by the sum of a voltage $V_{R1}$ due to a parasitic capacitance $C_{R1}$ and a voltage $V_{L1}$ due to a parasitic capacitance $C_{L1}$. As $V_{R1}$ is negative, $V_{L1}$ is positive, and $|V_{R1}|>|V_{L1}|$, the sum of $V_{R1}$ and $V_{L1}$ becomes negative.

Meanwhile, as shown in FIG. 3B, in a partitioned area where the pixel electrode 80 is positioned closer to the left-sided data line 61, since the distance between the pixel electrode 80 and the data line $D_j$ is longer than the distance between the pixel electrode 80 and the data line $D_{j-1}$, the parasitic capacitance of $C_{L2}$ becomes greater than that of $C_{R2}$. After the pixel voltage in the pixel area A becomes positive with respect to the common voltage, the reference voltage, the data line $D_j$ is changed from a positive state to a negative state to charge the next pixel row. After the pixel voltage in the pixel area C becomes negative with respect to the common voltage, the reference voltage, the $D_{j-1}$ data line 61 is changed from the negative state to the positive state to charge the next pixel row. Consequently, the pixel voltage in the pixel area A is varied by the sum of the voltage $V_{R2}$ due to the parasitic capacitance $C_{R2}$ and the voltage $V_{L2}$ due to the parasitic capacitance $C_{L2}$. As $V_{R2}$ is negative, $V_{L2}$ is positive, and $|V_{R2}|<|V_{L2}|$, the sum of $V_{R2}$ and $V_{L2}$ becomes negative.

As described above, the pixel voltages $V_p$ and $V_p$ during a storage time are varied to be lower than or greater than the charged voltage depending upon whether the data line is biased to the left side or the right side with respect to the pixel electrode. That is, as shown in FIG. 3C, the amount and the direction of the pixel voltage variation are differentiated depending upon the misalignment state of the mask.

Therefore, the difference in the degree of misalignment is made between the pixel electrode 80 and the data line 61 in the respective partitioned areas differentiates the pixel voltage variation, thereby causing non-uniformity in the brightness.

Next, that for a TFT array panel for an LCD according to an embodiment of the present invention is described with reference to FIGS. 4A and 4B.

Figure 4A:
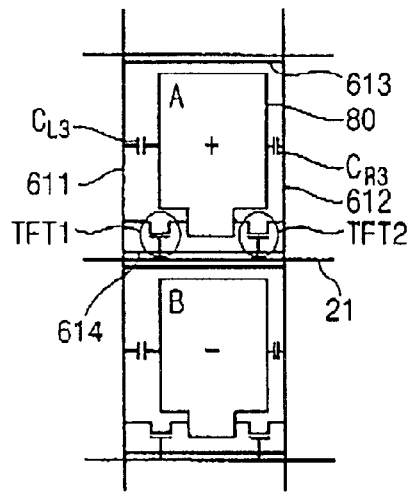
FIGS. 4A and 4B illustrate the way of preventing non-uniformity in the brightness between the partitioned areas in the TFT array panel according to the first embodiment of the present invention.
Figure 4B:
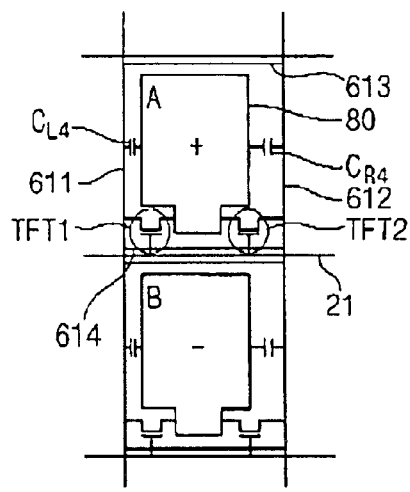

FIG. 4A illustrates the case where a first data line is biased to a pixel electrode, and FIG. 4B illustrates the case where a second data line is biased to a pixel electrode.

As shown in FIGS. 4A and 4B, pixel areas are defined by the intersections of gate lines 21 and first and second data lines 611 and 612. A pixel electrode 80 is formed in each pixel area. The first data line 611 is positioned left to the pixel electrode 80, and the second data line 612 is positioned right to the pixel electrode 80. The first and the second data lines 611 and 612 are connected to each other by way of data line connectors 613 and 614 formed at the top and the bottom sides of the pixel area. The gate line 21, the first and the second data lines 611 and 612 and the pixel electrode 80 are connected to first and second TFTs TFT1 and TFT2. In this configuration, a pixel voltage is applied to the pixel electrode 80 by way of the operation of the TFT upon receipt of a gate signal from the gate line 21 and a data signal from the first and the second data lines 611 and 612. The first and the second data lines 611 and 612 are connected to one data pad to thereby receive the same data signal.

Therefore, in the case the pixel electrode 80 is either positioned close to the second data line 612 as shown in FIG. 4A, and in the case it is positioned close to the first data line 611 as shown in FIG. 4B, it is changed into the same polarity so that variations of the pixel voltages are the same. This will be further described in detail.

First, as shown in FIG. 4A, in a partitioned area where the pixel electrode 80 is positioned closer to the second data line 612, since the distance between the pixel electrode 80 and the second data line 612 is shorter than the distance between the pixel electrode 80 and the first data line 611, the parasitic capacitance of $C_{R3}$ becomes greater than that of $C_{L3}$. After the pixel voltage in the pixel area A becomes positive with respect to the common voltage, the reference voltage, the first and the second data lines 611 and 612 are changed from a positive state to a negative state to charge the next pixel row. Accordingly, the pixel voltage in the pixel area A is varied by the sum of a voltage $V_{R3}$ due to the parasitic capacitance $C_{R3}$ and a voltage $V_{L3}$ due to the parasitic capacitance $CL_{L3}$. As the voltage with the same polarity is applied to the first and the second data lines 611 and 612, $V_{R3}$ and $V_{L3}$ are negative, and $|V_{R3}|>|V_{L3}|$. Consequently, the sum of $V_{R3}$ and $V_{L3}$ becomes negative.

Meanwhile, as shown in FIG. 4B, in a partitioned area where the pixel electrode 80 is positioned closer to the first data line 611, since the distance between the pixel electrode 80 and the first data line 611 is shorter than the distance between the pixel electrode 80 and the second data line 612, the parasitic capacitance of $C_{L4}$ becomes greater than that of $C_{R4}$. After the pixel voltage in the pixel area A becomes positive with respect to the common voltage, the reference voltage, the first and the second data lines 611 and 612 are changed from a positive state to a negative state to charge the next pixel row. Therefore, the pixel voltage in the pixel area A is varied by the sum of a voltage $V_{R4}$ due to the parasitic capacitance $C_{R4}$ and a voltage $V_{L4}$ due to the parasitic capacitance $C_{L4}$. As the voltage with the same polarity is applied to the first and the second data lines 611 and 612, $V_{R4}$ and $V_{L4}$ are negative, and $|V_{R4}|<|V_{L4}|$. Consequently, the sum of $V_{R4}$ and $V_{L4}$ becomes negative.

That is, the voltage variation of the pixel electrode at the turning point from the charge time to the storage time is made in the same negative direction irrespective of whether the data line is biased to the left side or the right side with respect to the pixel electrode. This is because the influence of the two data lines is divided left and right to the pixel electrode to be compensated.

Furthermore, in a case the pixel electrode 80 is positioned closer to the data line connector 613 at the top of the pixel area and in a case the pixel electrode 80 is located closer to the data line connector 614 at the bottom of the pixel area, since the data line connectors 613 and 614 are connected to the first and the second data lines 611 and 612 and changed into the same polarity, the variations in the pixel voltage are the same.

Meanwhile, conventionally, the parasitic capacitance between the gate electrode and the drain electrode in a partitioned area with a left-biased misalignment is different from that in a partitioned area with a right-biased misalignment. Consequently, the kick-back voltage and the pixel voltage are different between the two partitioned areas. However, the present invention does not make such a problem. That is, in both partitioned areas with a left-biased misalignment and with a right-biased misalignment, it is determined by the sum of the parasitic capacitance $C_{P1}$ between the first gate electrode 221 and the first drain electrode 631 and the parasitic capacitance $C_{P2}$ between the second gate electrode 222 and the second drain electrode 632, and $C_{P1}$ and $C_{P2}$ are compensated for each other. When the parasitic capacitance $C_{P1}$ is increased, the parasitic capacitance $C_{P2}$ is decreased. By contrast, when the parasitic capacitance $C_{P1}$ is decreased, the parasitic capacitance $C_{P2}$ is increased. Consequently, the sum of $C_{P1}$ and $C_{P2}$ is hardly differentiated.

A method of manufacturing a TFT array panel will be now described with reference to FIGS. 5A to 8B as well as FIGS. 1 and 2.

Figure 5A:
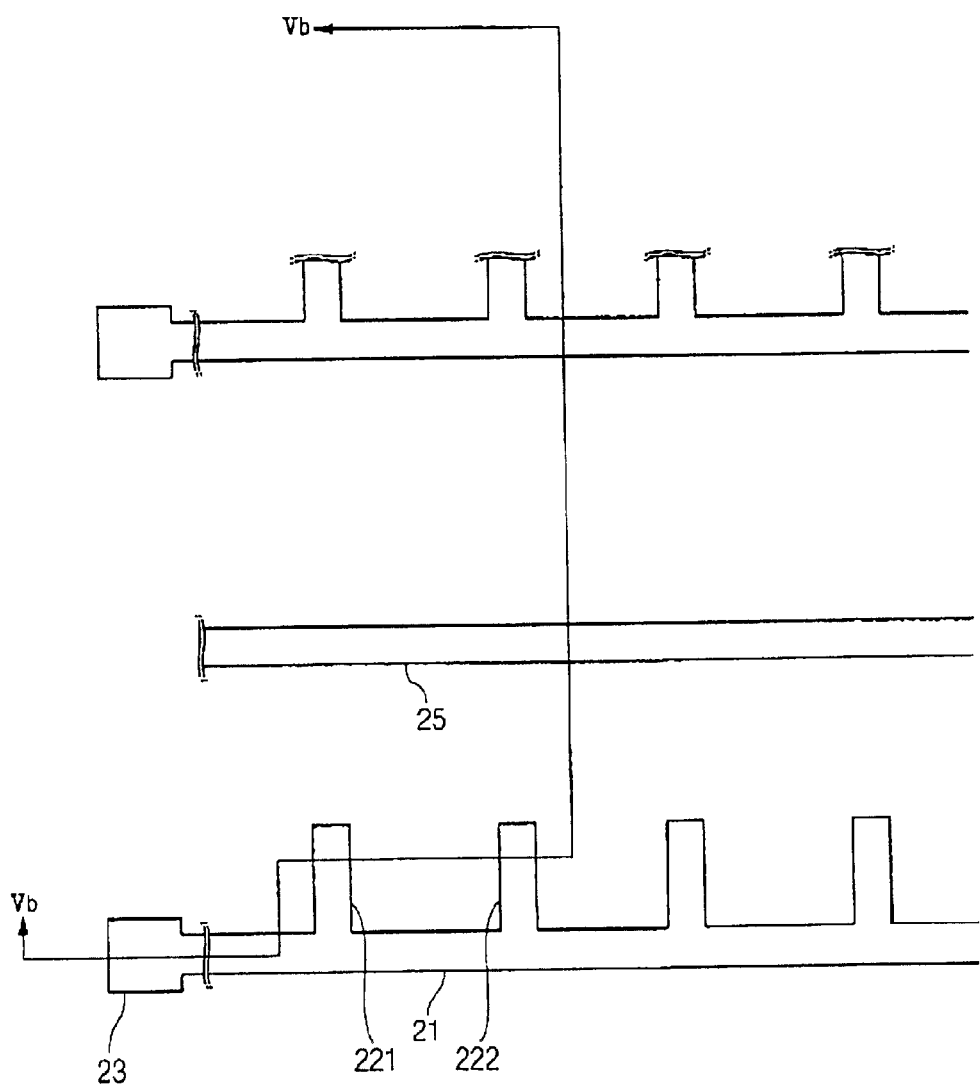
FIG. 5A is a layout view illustrating the first step of manufacturing the TFT array panel according to the first embodiment of the present invention.

As shown in FIGS. 5A and 5B, a metallic or conductive material for a gate wire with a thickness of 1,000–3,000 Å is deposited on an insulating substrate 10 by sputtering, etc., and patterned by photoetch using a mask to form a gate wire and storage electrode lines 25. The gate wire includes gate lines 21, first and second gate electrodes 221 and 222, and gate pads 23.

Figure 6A:
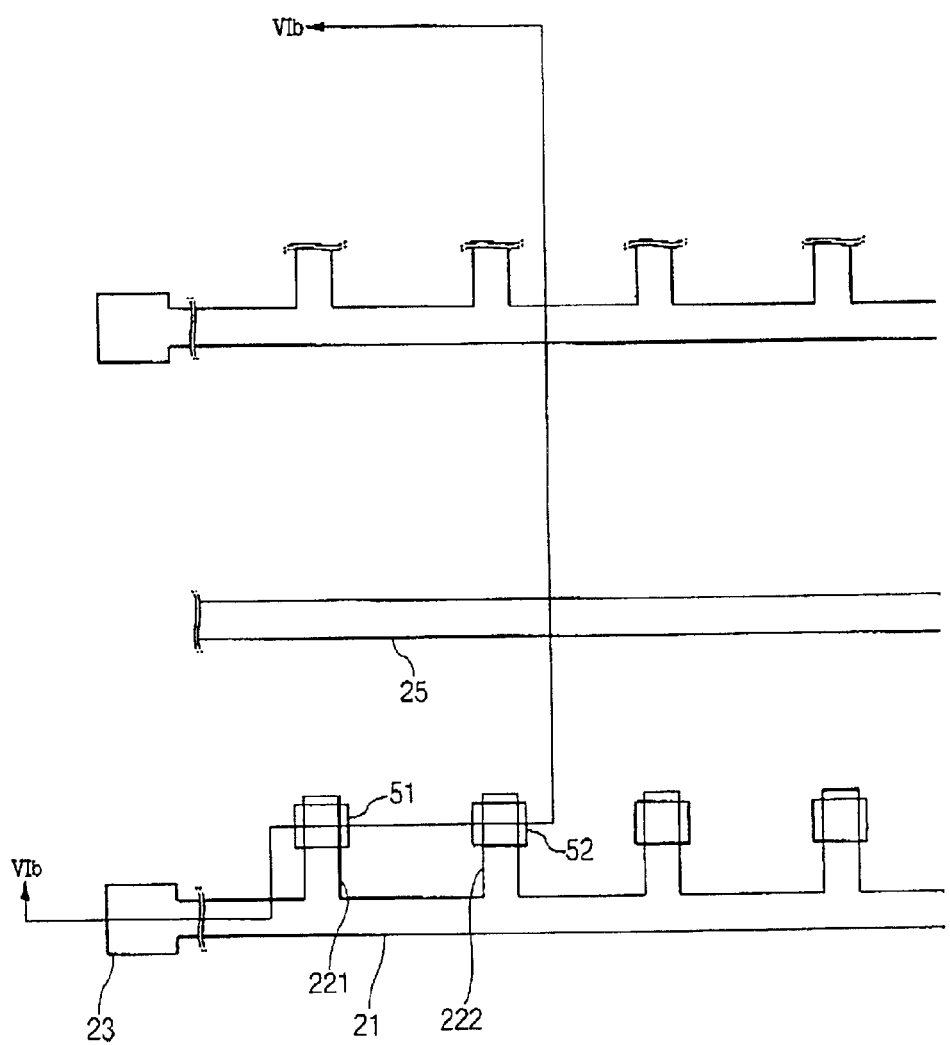
FIG. 6A is a layout view illustrating the step following the step illustrated in FIG. 5A.
Figure 6B:
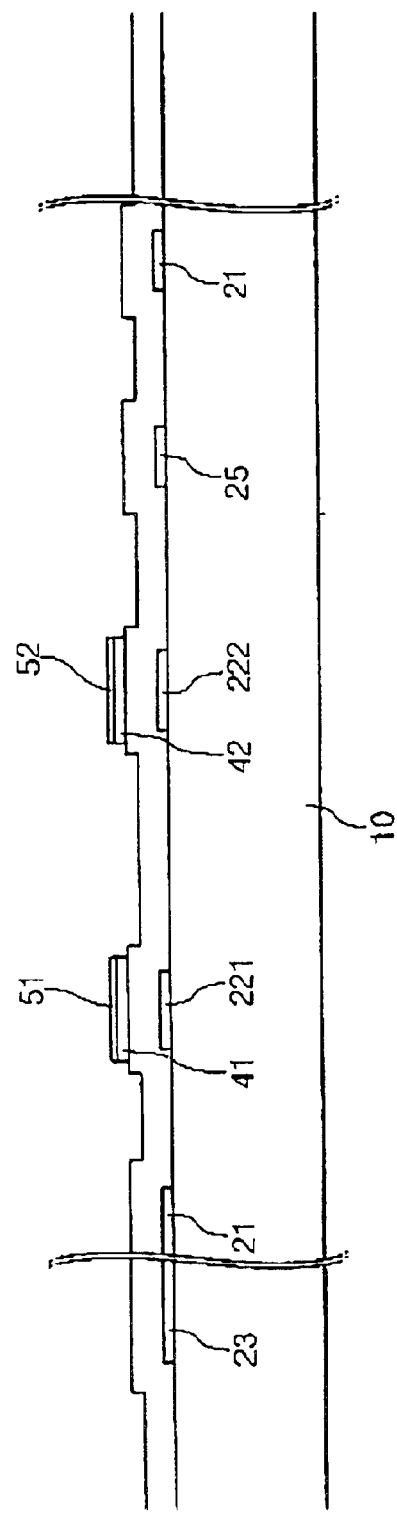
FIG. 6B is a sectional view taken along the line VIb—VIb of FIG. 6A.

Thereafter, as shown in FIGS. 6A and 6B, a gate insulating layer 30, an amorphous silicon layer and an n type impurity-doped amorphous silicon layer are sequentially deposited by chemical vapor deposition ("CVD"), etc., such that they bear a thickness of 1,500–5,000 Å, a thickness of 500–1,500 Å and a thickness of 300–600 Å, respectively. The upper two layers are patterned by photoetch using a mask to form semiconductor layers 41 and 42, and ohmic contact layers 51 and 52.

Figure 7B:
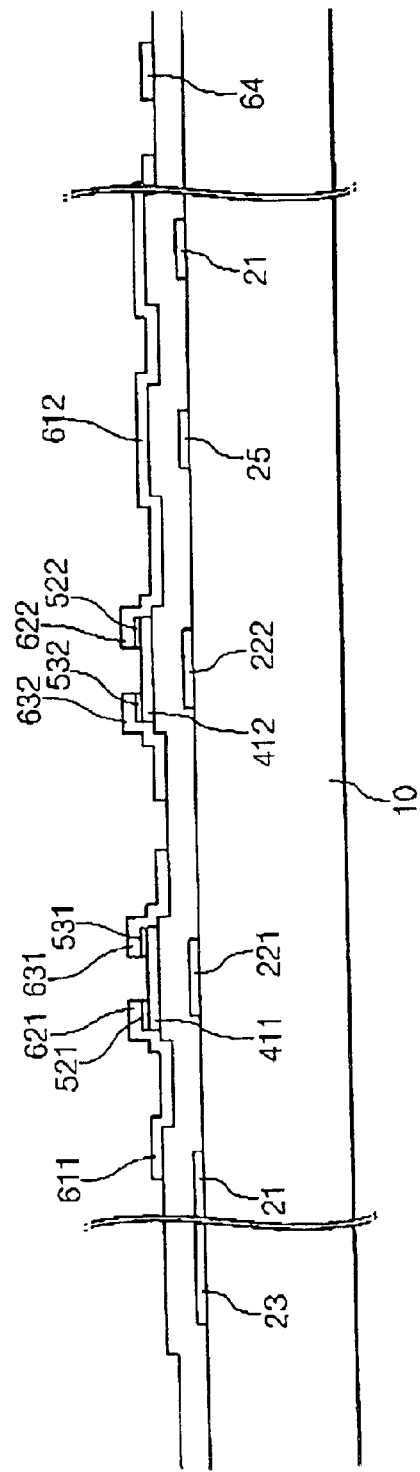
FIG. 7B is a sectional view taken along the line VIIb—VIIb of FIG. 7A.

As shown in FIGS. 7A and 7B, a metallic or conductive material for a data wire is deposited by sputtering, etc., such that it bears a thickness of 1,500–3,000 Å, and patterned by photoetch using a mask to form a data wire. The data wire includes first and second data lines 611 and 612, data line connectors 613 and 614, first and second source electrodes 621 and 622, first and second drain electrodes 631 and 632, and data pads 64. A portion of the ohmic contact layer 51 exposed between the first source electrodes 621 and the first drain electrodes 631 is removed such that the ohmic contact layer 51 is separated into two portions 521 and 531. A portion of the ohmic contact layer 52 exposed between the second source electrodes 622 and the second drain electrodes 632 is removed such that the ohmic contact layer 52 is separated into two portions 522 and 532.

Figure 8A:
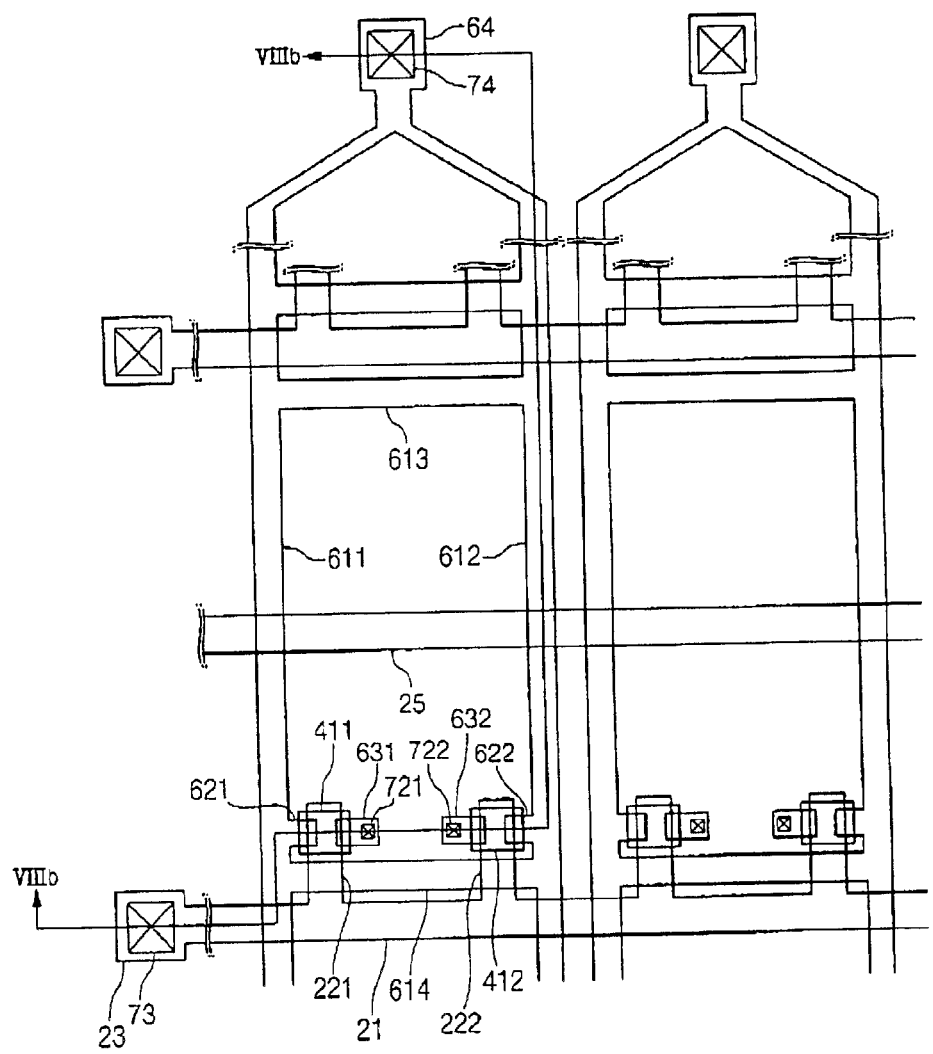
FIG. 8A a layout view illustrating the step following the step illustrated in FIG. 7A.

Then, as shown in FIGS. 8A and 8B, a passivation layer 70 with a thickness equal to or thicker than 3,000 Å is formed by depositing silicon nitride is deposited on the substrate 10 by CVD or by spin-coating an organic insulating material. The passivation layer 70 is patterned by photoetch using a mask to form contact holes 721, 722, 73 and 74.

As shown in FIGS. 1 and 2, a transparent conductive material such as ITO and IZO is deposited by sputtering, etc., such that it bears a thickness of 400–500 Å, and patterned by photoetch using a mask to form pixel electrodes 80, subsidiary gate pads 83 and subsidiary data pads 84.

The first embodiment of the present invention uses five photoetch steps to manufacture a TFT array panel. Alternatively, a TFT array panel may be manufactured by performing four photoetch steps. This will be now described as a second embodiment of the present invention with reference to FIGS. 9 to 17B.

First, a structure of a TFT array panel for an LCD according to a second embodiment of the present invention will be described with reference to FIGS. 9 and 10.

A gate wire 21, 221, 222 and 23 and storage electrode lines 25 are formed on an insulating substrate 10. The gate wire includes gate lines 21, first and second gate electrodes 221 and 222, and gate pads 23.

The gate wire 21, 221, 222 and 23 and the storage electrode lines 25 are covered by a gate insulating layer 30 preferably made of silicon nitride.

A semiconductor layer 413 preferably made of amorphous silicon is formed on the gate insulating layer 30. Ohmic contact layers 523, 533 and 534 preferably made of amorphous silicon doped with n type impurities such as phosphorous are formed on the semiconductor layer 413.

A data wire 611–614, 621, 622, 631, 632 and 64 is formed on the ohmic contact layers 523, 533 and 534. The data wire includes first and second data lines 611 and 612, data line connectors 613 and 614, first and second source electrodes 621 and 622, first and second drain electrodes 631 and 632, and data pads 64.

The ohmic contact layers 523, 533 and 534 have a role of reducing the contact resistance between the underlying semiconductor layer 413 and the overlying data wire 611–614, 621, 622, 631, 632 and 64, and bear the same planar shape as the data wire 611–614, 621, 622, 631, 632 and 64.

Meanwhile, the semiconductor layer 413 has the same planar shape as the data wire 611–614, 621, 622, 631, 632 and 64 and the ohmic contact layers 523, 533 and 534 except for the channel portions C of first and second TFTs.

A passivation layer 70 is formed on the data wire 611–614, 621, 622, 631, 632 and 64. The passivation layer 70 has a contact hole 74 exposing the data pad 64, and a contact hole 73 exposing the gate pad 23 together with the gate insulating layer 30. Furthermore, the passivation layer 70 has contact holes 721 and 722 exposing the first and the second drain electrodes 631 and 632.

Pixel electrodes 80, subsidiary gate pads 83 and subsidiary data pads 84 preferably made of a transparent conductive material such as ITO and IZO are formed on the passivation layer 70.

A method of manufacturing a TFT array panel for an LCD according to the second embodiment of the present invention will be now described with reference to FIGS. 11A to 17B as well as FIGS. 9 and 10.

Figure 11A:
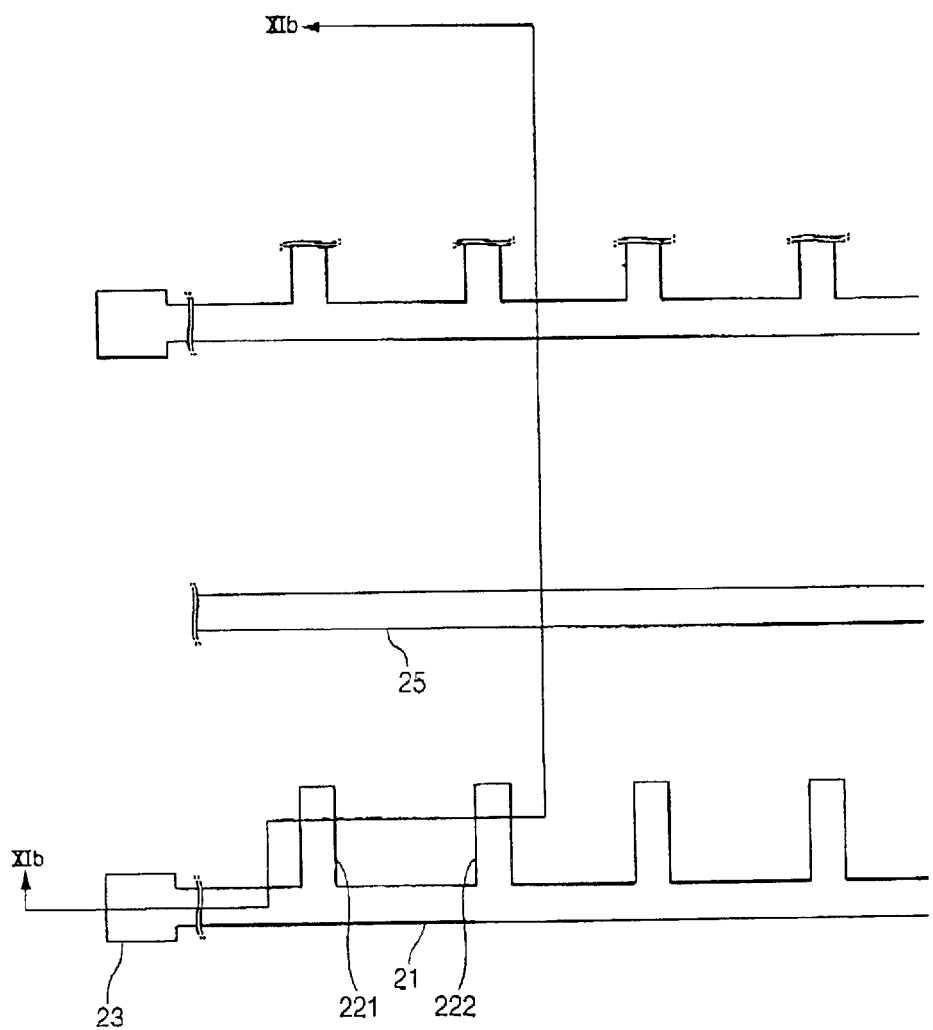
FIG. 11A is a layout view of a TFT array panel illustrating the first step of manufacturing the TFT array panel according to the second embodiment of the present invention.

As shown in FIGS. 11A and 11B, a metallic or conductive material for a gate wire is deposited on an insulating substrate 10, and patterned by a first photoetch step to form a gate wire and storage electrode lines 25. The gate wire includes gate lines 21, first and second gate electrodes 221 and 222, and gate pads 23.

Figure 12:
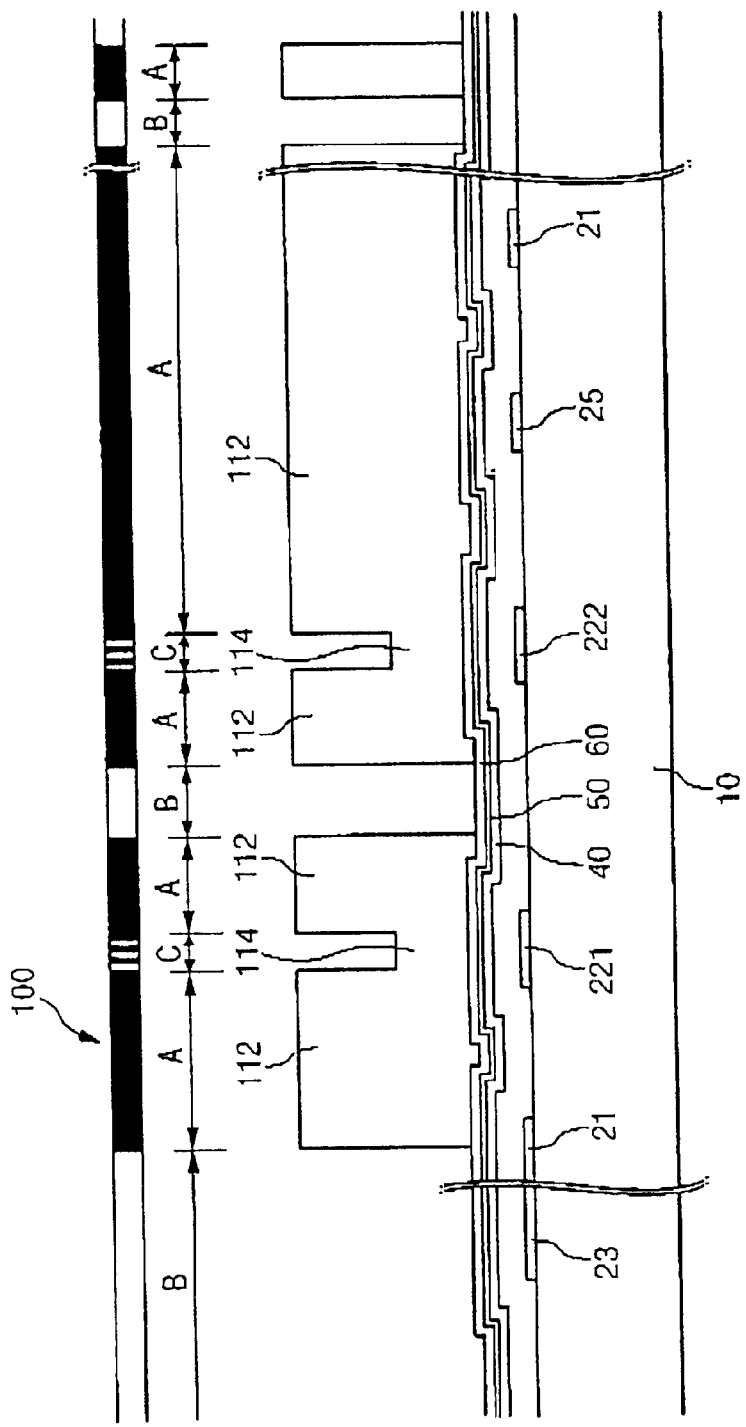
FIG. 12 is a sectional view illustrating the step following the step illustrated in FIG. 11A.

Thereafter, as shown in FIG. 12, a gate insulating layer 30, an amorphous silicon layer 40, a doped amorphous silicon layer 50 and a conductive layer 60 for a data wire are sequentially deposited.

In a second photolithography step, after a photoresist film 110 with a thickness of 1–2 μm is coated and exposed to light through a mask 100 having a position-dependent light transmittance, the photoresist film 110 is developed to form a photoresist pattern 112 and 114. A first portion 112 of the photoresist pattern is placed in a channel area C of first and second TFTs, located between a first source electrode 621 and a first drain electrode 631 as well as between a second source electrode 622 and a second drain electrode 632. A second portion 114 of the photoresist pattern is placed in a data wire area A, where a data wire 611–614, 621, 622, 631, 632 and 64 will be formed. The first portion 114 has a thickness smaller than that of the second portion 112. The photoresist film in the remaining area B is all removed.

The position-dependent thickness of the photoresist film is obtained by several techniques. In order to adjust the light transmittance at the C area, a slit or lattice pattern is provided or a semitransparent film may be used.

It is preferable that the width of the pattern between the slits or the distance between the patterns, i.e., the width of the slits is established to be smaller than the light resolution of the light exposer. When using the semitransparent film, thin films with different light transmittance or with different thickness may be used.

The first portion 114 of the photoresist film may be formed using a reflowable photoresist film. After the reflowable photoresist film is exposed to light through a usual mask with a transparent portion and an opaque portion, and developed, the photoresist film is reflowed such that a portion of the film flows onto an area with no photoresist.

Thereafter, the photoresist pattern and the underlying layers including the conductive layer 60, the doped amorphous silicon layer 50 and the amorphous silicon layer 40 are etched such that the data wire and the underlying layers are left in the data wire area A, only the amorphous silicon layer is left in the channel area C, and the three layers 60, 50 and 40 are removed to expose the gate insulating layer 30 in the remaining area B.

Figure 13:
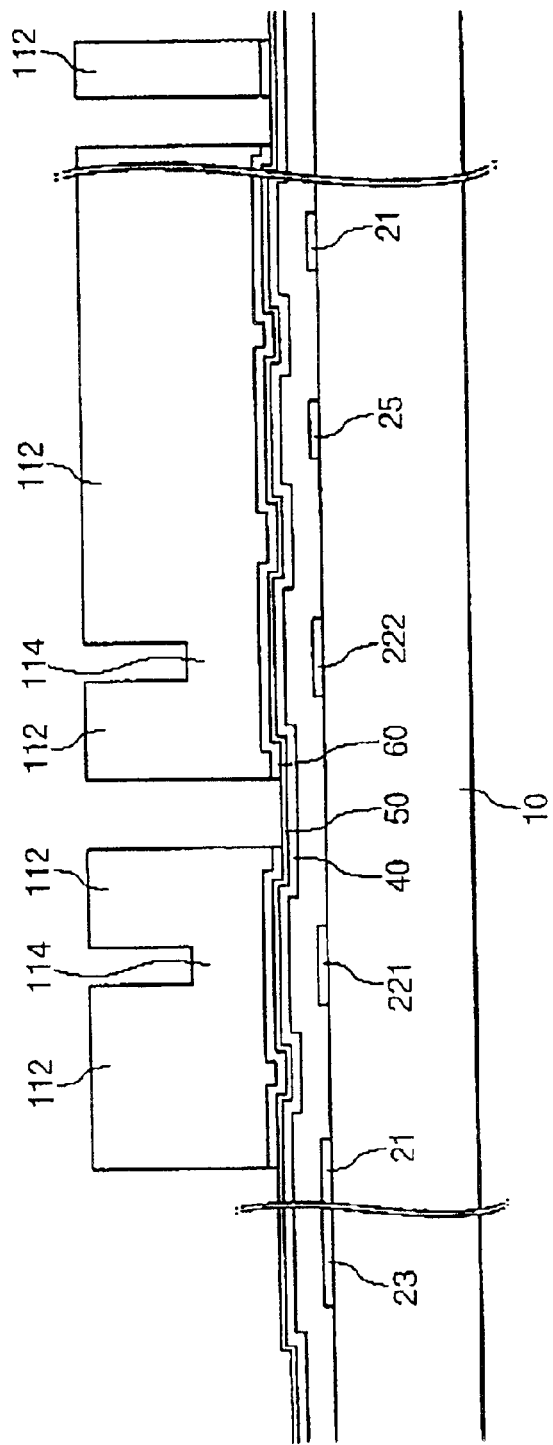
FIGS. 13 to 15 are sectional views sequentially illustrating the steps following the step illustrated in FIG. 12.

For that purpose, as shown in FIG. 13, an exposed portion of the conductive layer 60 in the area B is removed to expose the underlying doped amorphous silicon layer 50. This process is preferably performed in condition that the photoresist pattern 112 and 114 is not nearly etched.

Figure 14:
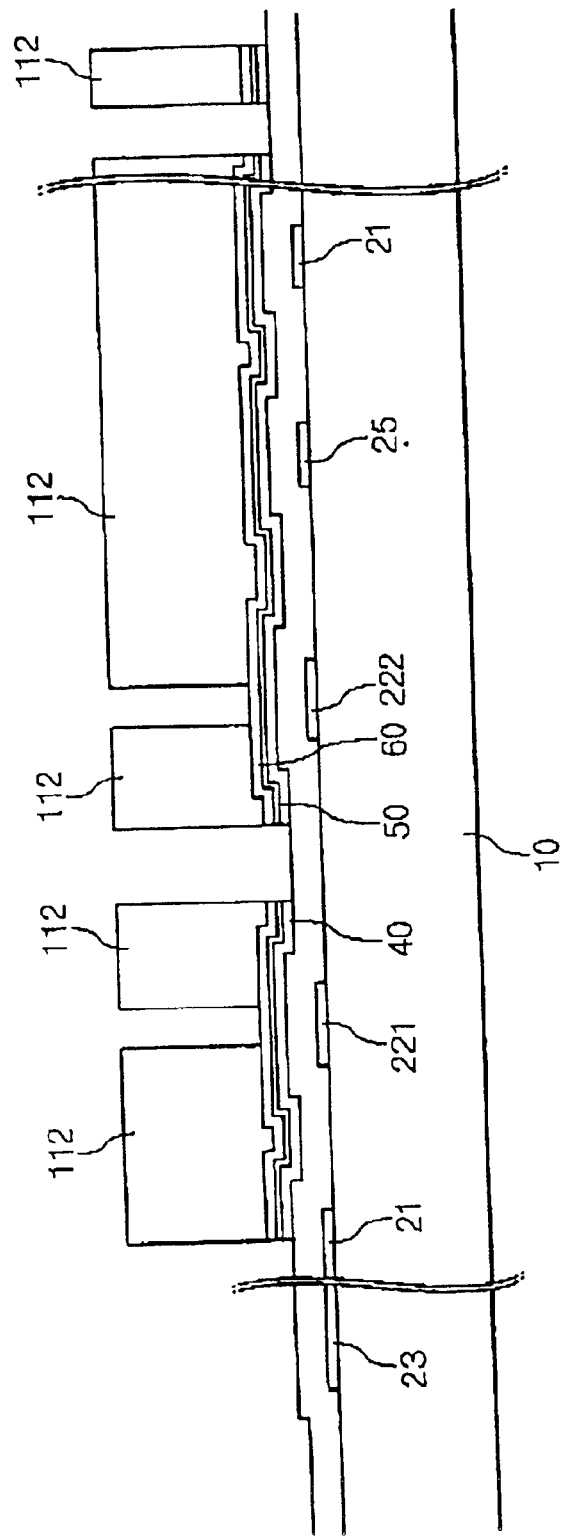

Thereafter, as shown in FIG. 14, portions of the doped amorphous silicon layer 50 and the underlying amorphous silicon layer 40 in the area B are simultaneously removed together with the first portion 114 by way of dry etching. The etching is preferably performed in condition that the photoresist pattern 112 and 114, the doped amorphous silicon layer 50 and the amorphous silicon layer 40 are simultaneously etched, but the gate insulating layer 30 is not etched.

Consequently, the first portion 114 in the channel area C is removed to expose the conductive layer 60. The doped amorphous silicon layer 50 and the amorphous silicon layer 40 in the area B are removed to expose the underlying gate insulating layer 30. The second portion 112 in the data wire area A is also etched to have reduced thickness.

The photoresist residue on the surface of the conductive layer 60 in the channel area C is removed by ashing.

Figure 15:
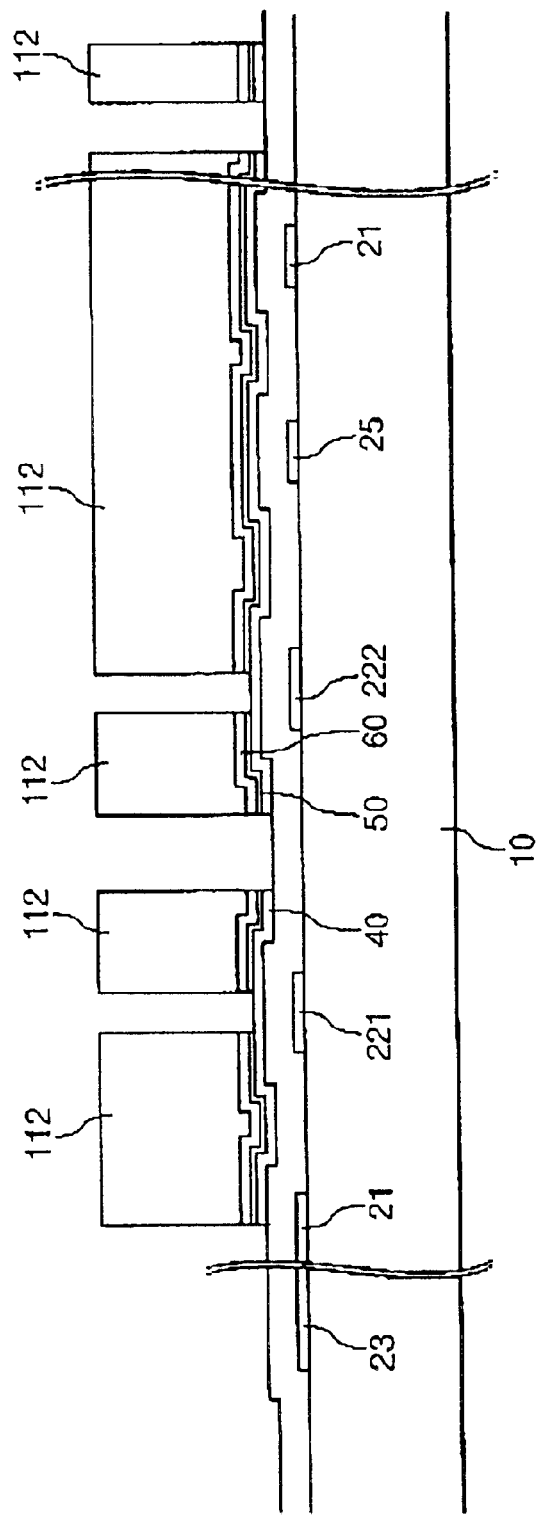

As shown in FIG. 15, portions of the conductive layer 60 and the underlying doped amorphous silicon layer 50 in the channel area C are removed by etching.

Figure 16A:
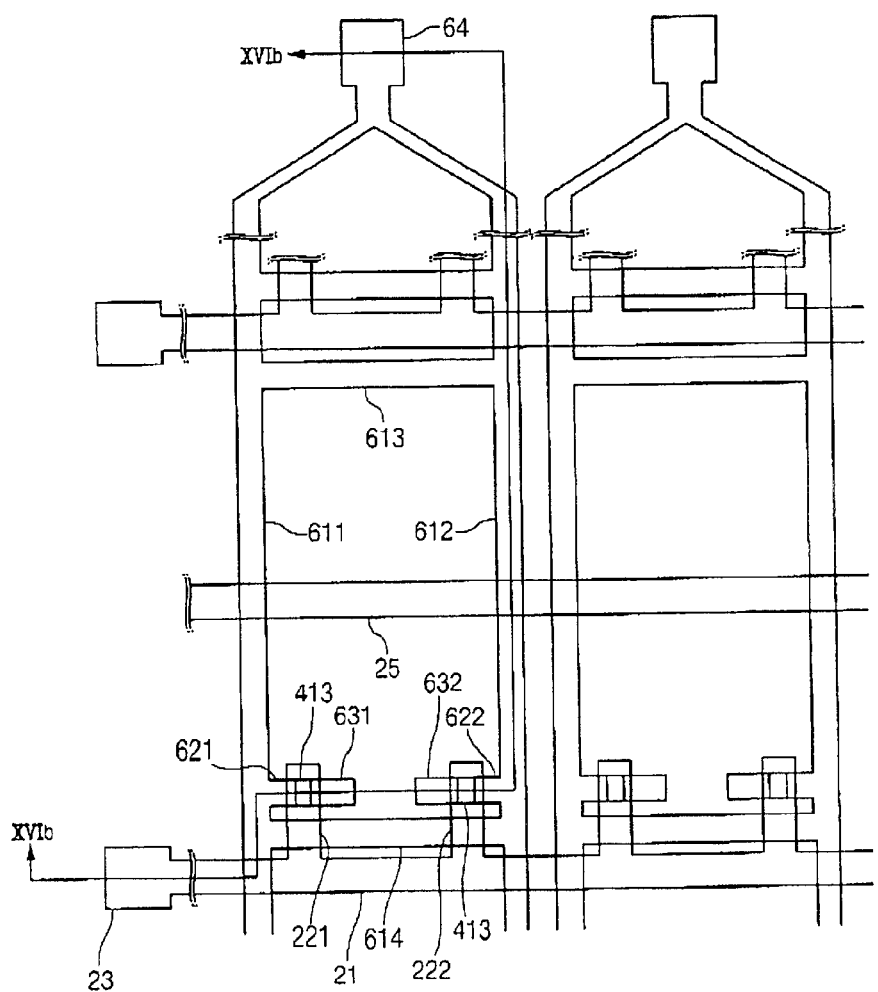
FIG. 16A is a layout view illustrating the step following the step illustrated in FIG. 15.
Figure 16B:
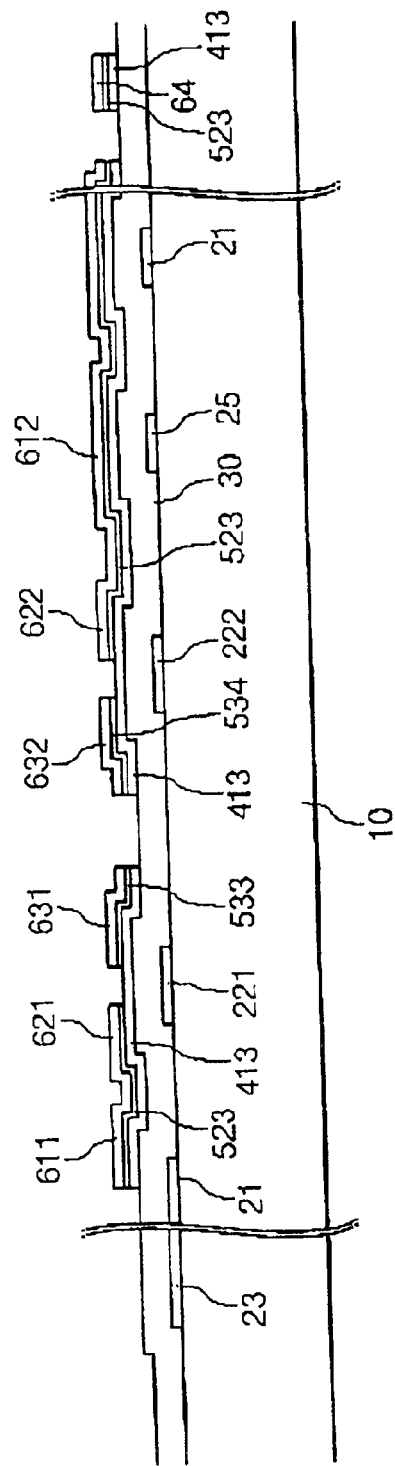
FIG. 16B is a sectional view taken along the line XVIb—XVIb of FIG. 16A.

Finally, the second portion 112 in the data wire area A is removed. Consequently, as shown in FIGS. 16A and 16B, the first source electrode 621 and the first drain electrode 631 as well as the second source electrode 622 and the second drain electrode 632 are separated from each other so that the data wire 611–614, 621, 622, 631, 632 and 64 and the underlying ohmic contact layers 523, 533 and 534 and semiconductor layer 413 are completed.

Figure 17A:
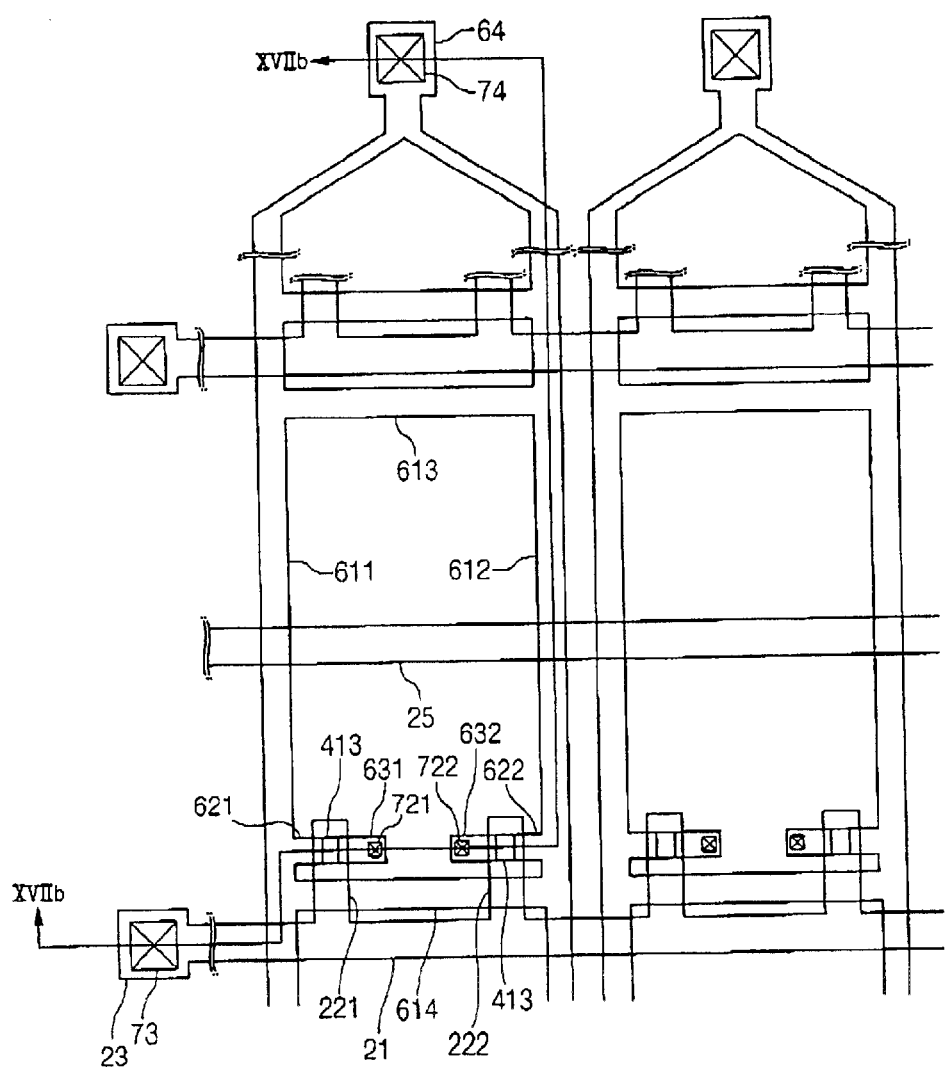
FIG. 17A a layout view illustrating the step following the step illustrated in FIG. 16A.
Figure 17B:
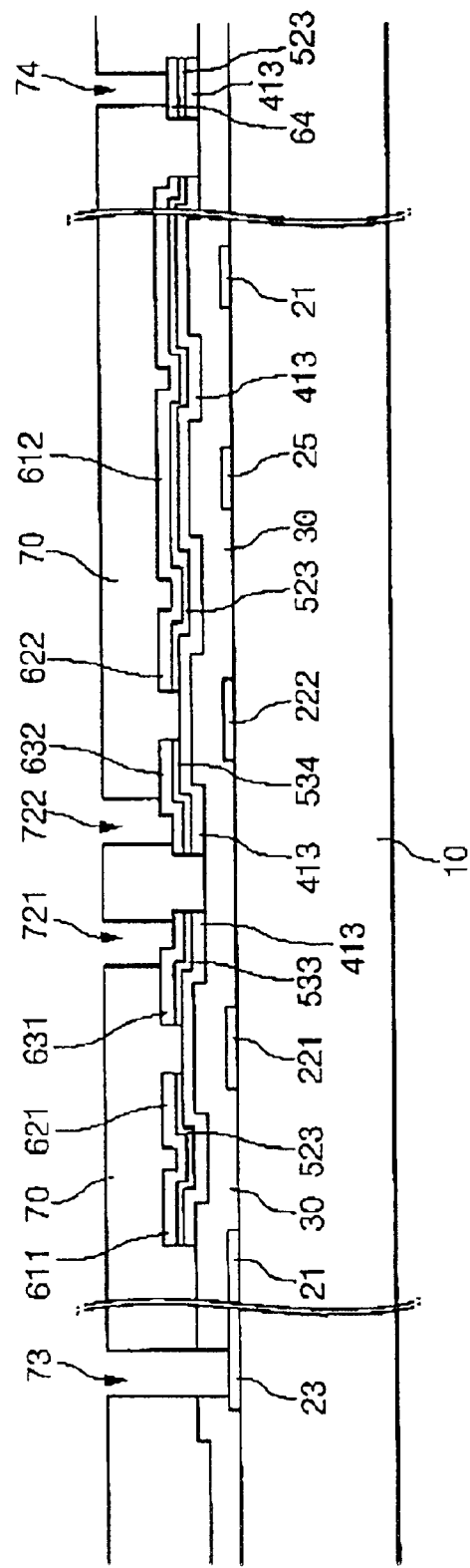
FIG. 17B is a sectional view taken along the line XVIIb—XVIIb of FIG. 17A.

After the data wire 611–614, 621, 622, 631, 632 and 64 is completed, as shown in FIGS. 17A and 17B, a passivation layer 70 is formed by depositing silicon nitride as in the first embodiment, and patterned through a third photoetch step to form contact holes 721, 722, 73 and 74.

Figure 9:
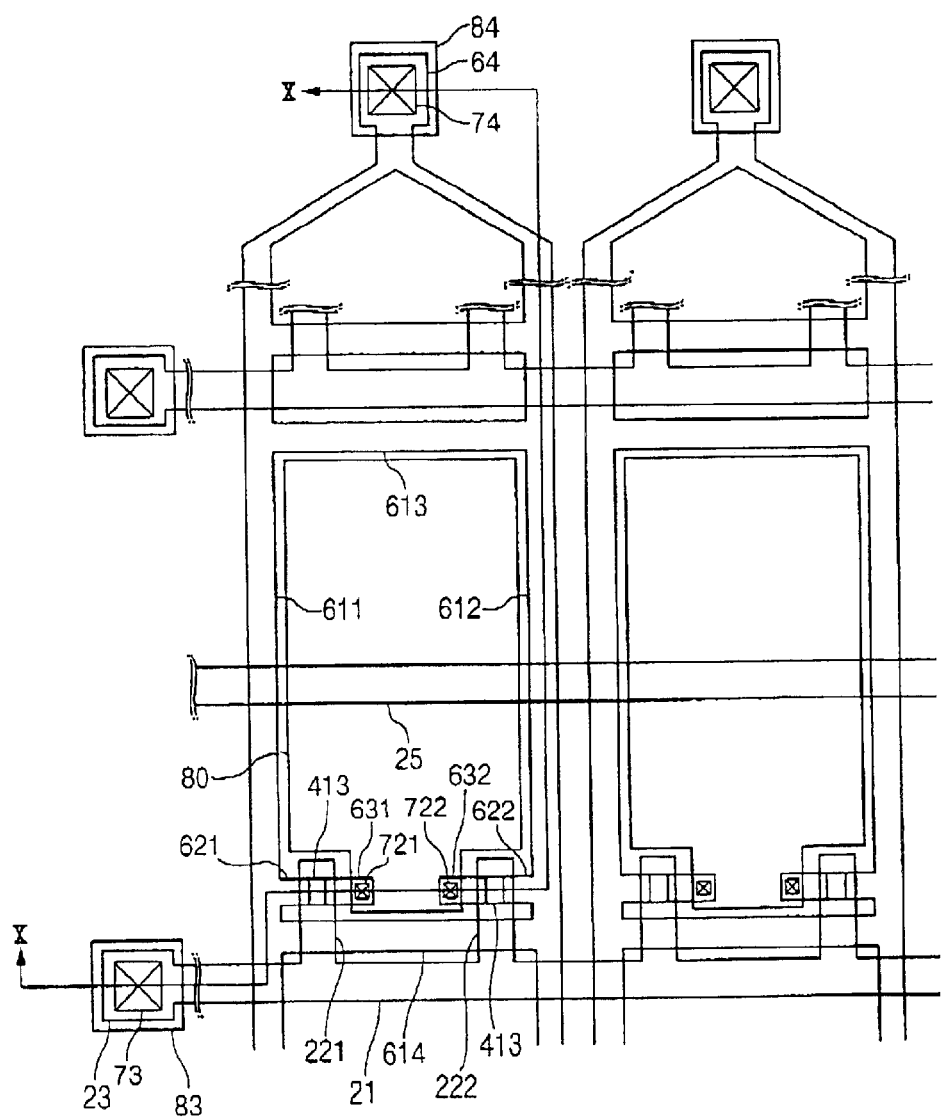
FIG. 9 is a layout view of a TFT array panel for an LCD according to a second embodiment of the present invention.
Figure 10:
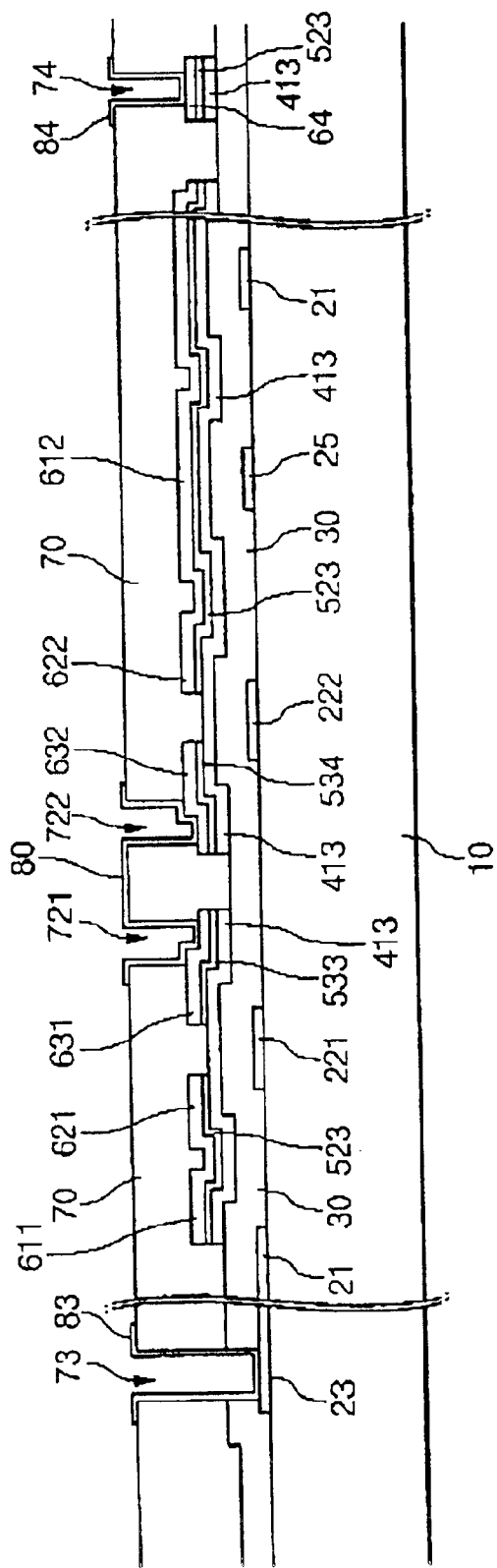
FIG. 10 is a sectional view taken along the line X—X of FIG. 9.

Finally, as shown in FIGS. 9 and 10, a transparent conductive material such as ITO and IZO is deposited, and patterned by a fourth photoetch step to form pixel electrodes 80, subsidiary gate pads 83, and subsidiary data pads 84, as in the first embodiment.

The second embodiment of the present invention simplifies the manufacturing process by forming the data wire 611–614, 621, 622, 631, 632 and 64 and the underlying ohmic contact layers 523, 533 and 534 and semiconductor layer 413 by one photolithography step, as well as has the same advantage as the first embodiment.

As described above, the present invention provides the data line at opposite sides of the pixel area so that variation in the pixel voltage due to the parasitic capacitance between the partitioned areas with different degree of misalignment is reduced. In addition, two TFTs are provided in each pixel area so that the parasitic capacitance between the gate and the drain electrodes in two respective partitioned areas with left-biased and right-biased misalignment is kept to be constant. In this way, the pixel voltage variation between the two partitioned areas is reduced to prevent non-uniformity in the brightness.

Next, the structure of an LCD according to a fourth embodiment of the present invention will be described in detail.

Figure 18:
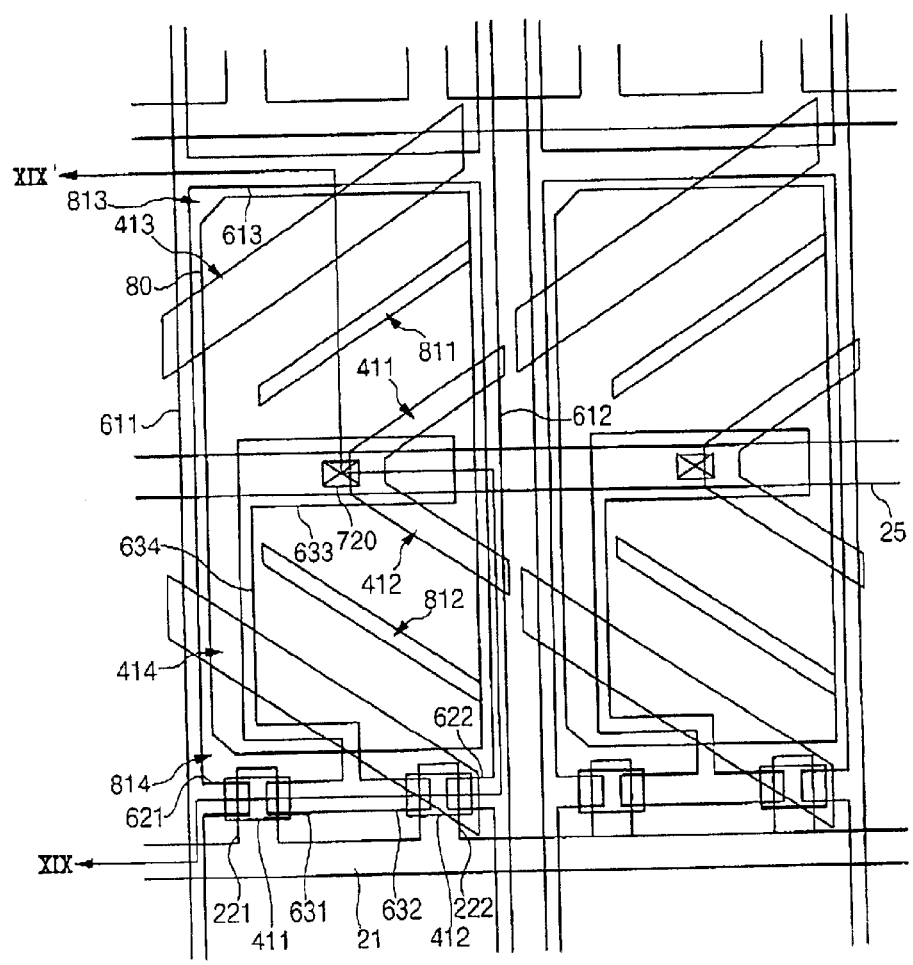
FIG. 18 is a layout view of an LCD according to a third embodiment of the present invention.
Figure 19:
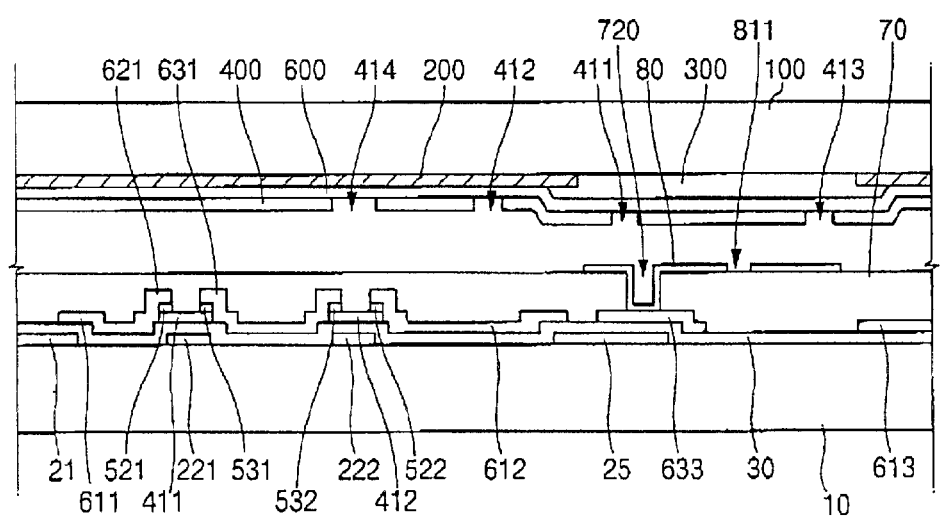
FIG. 19 is a sectional view taken along the line XIX–XIX' of FIG. 18.

FIG. 18 is a layout view of an LCD according to a fourth embodiment of the present invention, and FIG. 19 is a sectional view taken along the line XIX–XIX' of FIG. 18.

First, the structure of a "lower panel" of an LCD according to the fourth embodiment of the present invention will be described.

As shown in FIGS. 18 and 19, in the TFT array panel, the "lower panel", a gate wire 21, 221 and 222 and storage electrode lines 25 are formed on an insulating substrate 10 with a metallic or conductive material such as Al, Al alloy, Mo, MoW alloy, Cr and Ta. The gate wire includes a plurality of gate lines 21 extending in the transverse direction, and first and second gate electrodes 221 and 222 which are parts of the gate lines 21 and spaced apart from each other with a predetermined distance. The storage electrode line 25 is placed between the gate lines 21 while extending parallel thereto. The storage electrode lines 25 applied with the common voltage from an external source overlap pixel electrodes 80 or storage capacitor conductive patterns 633, which will be described later, to form storage capacitors for enhancing the charge storage capacity of pixels.

The gate wire 21, 221 and 222 and the storage electrode lines 25 may be have a single-layered structure, a double-layered structure or a triple-layered structure. In the case of the multiple-layered structure, one layer is made of a low resistance material, and the other layer is made of a material bearing a good contact characteristic with other materials. For instance, Cr/Al or Al alloy, or Al or Al alloy/Mo may be used.

The gate wire 21, 221 and 222 and the storage electrode lines 25 are covered by a gate insulating layer 30 preferably made of silicon nitride (SiNx).

A first semiconductor layer 411 preferably made of amorphous silicon is formed on the gate insulating layer 30 opposite the first gate electrode 221. An ohmic contact layer 521 and 531 preferably made of amorphous silicon doped with n-type impurities such as phosphorous P is formed on the first semiconductor layer 411, and separated into two portions with respect to the first gate electrode 221. Meanwhile, a second semiconductor layer 412 is formed on the gate insulating layer 30 opposite the second gate electrode 222. An ohmic contact layer 522 and 532 is formed on the second semiconductor layer 412 and separated into two portions with respect to the second gate electrode 222.

A data wire 611–613, 621, 622, and 631–634 is formed on the ohmic contact layers 521, 531, 522 and 532 and the gate insulating layer 30. The data wire 611–613, 621, 622 and 631–634 is made of metallic or conductive material such as Al or Al alloy, Mo or MoW alloy, Cr or Ta. The data wire includes first and second data lines 611 and 612 which extend in the longitudinal direction and are spaced apart from each other. The first and the second data lines 611 and 612 intersect the gate lines 21 to thereby define pixel areas. The data wire further includes a plurality of data line connectors 613, adjacent to the gate lines 21, for interconnecting the first and the second data lines 611 and 612. The data wire further includes first source electrodes 621 which are portions of the first data lines 611, first drain electrodes 631 opposite the first source electrodes 621 with respect to the first gate electrodes 221, second source electrodes 622 which are portions of the second data lines 612, second drain electrodes 632 opposite the second source electrodes 622 with respect to the second gate electrodes 222, storage capacitor conductive patterns 633, and conductor pattern connectors 634. The first and the second drain electrodes 631 and 632 forms one pattern to be connected. The storage capacitor conductive patterns 633 are connected to the drain electrodes 631 and 632 via the conductor pattern connectors 634 extending from the drain electrodes 631 and 632, and overlap the storage electrode lines 25.

The data wire 611–613, 621, 622 and 631–634 may have a single-layered structure, a double-layered structure or a triple-layered structure. In the case of the multiple-layered structure, one layer is made of a low resistance material, and the other layer is made of a material bearing a good contact characteristic with other materials.

The first gate electrode 221, the first semiconductor layer 411, the first source electrode 621 and the first drain electrode 631 form a first TFT, while the second gate electrode 222, the second semiconductor layer 412, the second source electrode 622 and the second drain electrode 632 form a second TFT.

A passivation layer 70 preferably made of silicon nitride is formed on the data wire 611–613, 621, 622, and 631–634 and the gate insulating layer 30 with silicon nitride. The passivation layer 70 has a contact hole 720 exposing the storage capacitor conductive pattern 633.

Pixel electrodes 80 preferably made of a transparent conductive material such as ITO and IZO are formed on the passivation layer 70.

The pixel electrodes 80 are connected to the storage capacitor conductive patterns 633 through the contact holes 720 to receive image signals from the first and the second drain electrodes 631 and 632.

An aperture pattern including first to fourth apertures 811–814 is formed at the pixel electrode 80. The apertures 811–814 of the pixel electrode 80 together with an opening pattern 411, 412, 413 and 414 formed at a common electrode 400 of an "upper panel" control the tilt of the liquid crystal molecules to form a plurality of domains.

The first aperture 811 is located at the upper half part of the rectangular-shaped pixel electrode 80, and obliquely extends from the right side to the left side, and the second aperture 812 is longitudinally symmetrical to the first aperture 811 with respect to the center of the pixel electrode 80. The third aperture 813 has a shape where the left end portion of the upper half part of the pixel electrode 80 is obliquely cut off. The fourth aperture 814 is longitudinally symmetrical to the second aperture 812 with respect to the center of the pixel electrode 80.

Alternatively, a protrusion pattern may be formed at the pixel electrode 80 instead of the opening pattern.

An "upper panel" of an LCD according to the fourth embodiment of the present invention, which is opposite the "lower panel," will be now described.

As shown in FIGS. 18 and 19, in a color filter panel, an upper panel, a black matrix 200 is formed on a transparent insulating substrate 100 such as glass, and a color filter 300 is formed on the black matrix 200. An overcoat layer 600 is formed on the color filter 300, and a common electrode 400 is formed on the overcoat layer 600 made of a transparent conductive material such as ITO and IZO.

An opening pattern including first to fourth openings 411–414 is formed at the common electrode 400. The openings 411–414 together with the aperture pattern of the pixel electrode 80 control the tilt of the liquid crystal molecules to form a plurality of domains The first opening 411 is located at the upper half part of the common electrode 400, and obliquely extends from the right side to the left side. The second opening 412 is connected to the first opening 411 near the center of the common electrode 400, and longitudinally symmetrical to the first opening 411 with respect to the center of the common electrode 400. The third opening 413 is located higher than the first opening 411 at the upper half part of the common electrode 400, and obliquely extends from the right side to the left side. The fourth opening 414 is longitudinally symmetrical to the second opening 412 with respect to the center of the common electrode 400.

The opening pattern 411, 412, 413 and 414 obliquely formed at the common electrode 400, and the aperture pattern obliquely formed at the pixel electrode 80 are arranged in an alternate manner.

Alternatively, a protrusion pattern is formed at the common electrode 400 instead of the opening pattern.

Next, the structure of an LCD according to a fourth embodiment of the present invention will be described in detail.

Figure 20:
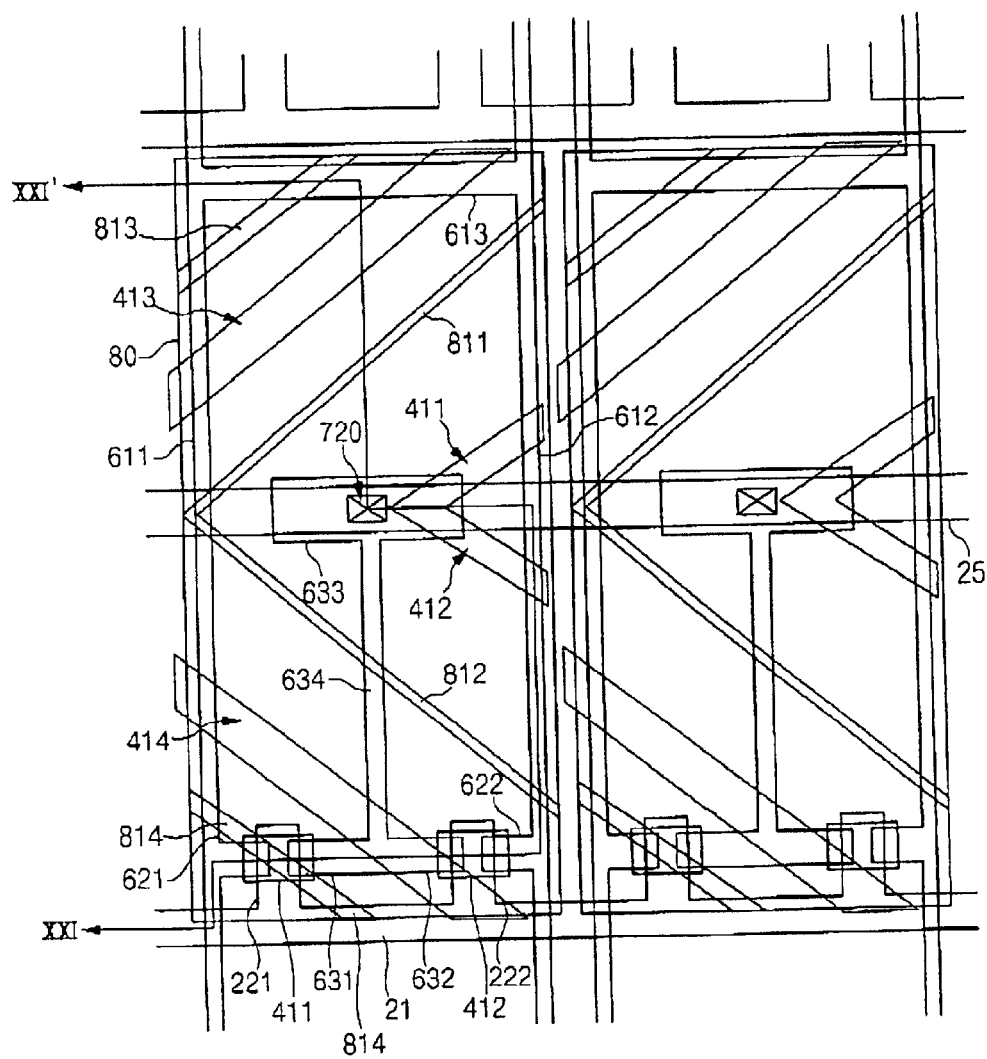
FIG. 20 is a layout view of an LCD according to a fourth embodiment of the present invention.
Figure 21:
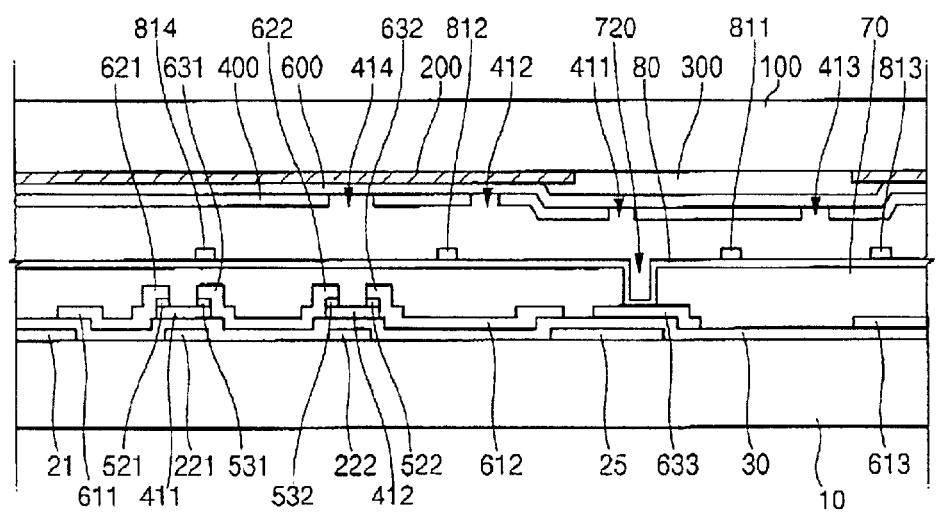
FIG. 21 is a sectional view taken along the line XXX–IXI' of FIG. 20.

FIG. 20 is a layout view of an LCD according to a fourth preferred embodiment of the present invention, and FIG. 21 is a sectional view taken along the line XXX–IXI' of FIG. 20.

As shown in FIGS. 20 and 21, the structure of a "lower panel" and an "upper panel" according to the present invention is the same as that of the third embodiment of the present invention, except for the shape of a storage capacitor conductive pattern 633 and a conductor pattern connector 634 interconnecting first and second drain electrodes 631 and 632, a pixel electrode 80 and a passivation layer 70 formed on a data wire on the "lower panel".

The conductor pattern connector 634 of the "lower panel" of the LCD according to the third embodiment of the present invention extends from the interconnecting point of the first and the second drain electrodes 631 and 632 across the center, and is connected to the storage capacitor conductive pattern 633 overlapping the storage electrode line 25.

The passivation layer 70 formed on the data wire has a relatively large thickness, compared with to that according to the third embodiment. The pixel electrode 80 on the passivation layer 70 completely overlaps the data wire 611–613, 621, 622 and 631–634 including first and second data lines 611 and 612 for receiving the same data signal as the pixel electrode 80.

The passivation layer 70 has a thickness of 3 $\mu$m or more.

A protrusion pattern including first to fourth protrusions 811–814 is formed at the pixel electrode 80. The protrusion pattern 811–814 adjusts the tilt of the liquid crystal molecules along with an opening pattern 411 to 414 of the common electrode 400, thereby forming a plurality of domains.

The first protrusion 811 is located at the upper half part of the pixel electrode 80, and obliquely extends from the right side to the left side. The second protrusion 812 is connected to the first protrusion 811 at the center of the pixel electrode 80, and longitudinally symmetrical thereto. The third protrusion 813 is located at the upper half part of the pixel electrode 80 above the first protrusion 811, and obliquely extends. The fourth protrusion 814 is longitudinally symmetrical to the second protrusion 812 with respect to the center of the pixel electrode 80.

The oblique protrusion pattern at the pixel electrode 80 and the oblique opening pattern at the common electrode 400 are alternately arranged such that they are deviated from each other.

Alternatively, an aperture pattern may be formed at the pixel electrode 80 instead of the protrusion pattern 811 to 814.

The third and the fourth embodiments may include gate pads connected to the gate lines 21 to receive gate signals from an external source, and subsidiary gate pads formed on the gate pads and made of the same conductive material as the pixel electrode 80.

The embodiments may also include data pads located at a place external to the display area, where the first and the second data lines 611 and 612 go together to be applied with the same signal, and subsidiary data pads formed on the data pads and made of a conductive material for the pixel electrode 80.

The passivation layer 70 has contact holes exposing the gate and the data pads, respectively, such that the gate and the data pads are electrically connected to the subsidiary gate and data pads through the contact holes, respectively.

As described above, the pixel electrode completely overlaps the dual data lines 611 and 612, thereby enhancing the aperture ratio. This will be further described with reference to FIGS. 22 and 23.

First, a structure of a conventional LCD, which reduces the aperture ratio, will be described.

Figure 22:
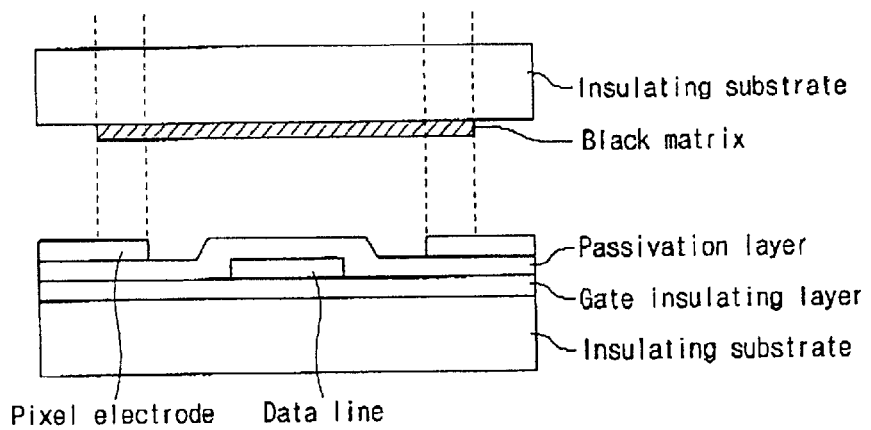
FIG. 22 is a schematic sectional view of a conventional LCD.

FIG. 22 schematically illustrates the section of a conventional LCD.

In a conventional LCD shown in FIG. 22, one data line extends between the pixels, and the pixel electrode does not overlap the data line for preventing the signal intervention thereof. In order to prevent light leakage near the data line, a black matrix is formed at the "upper panel." In consideration of the viewing angle, the black matrix extends over the pixel electrode, but this results in decreased aperture ratio.

Furthermore, the liquid crystal may exhibit abnormal operation at the periphery of the pixel electrode due to the electric field generated from the data line.

Figure 23:
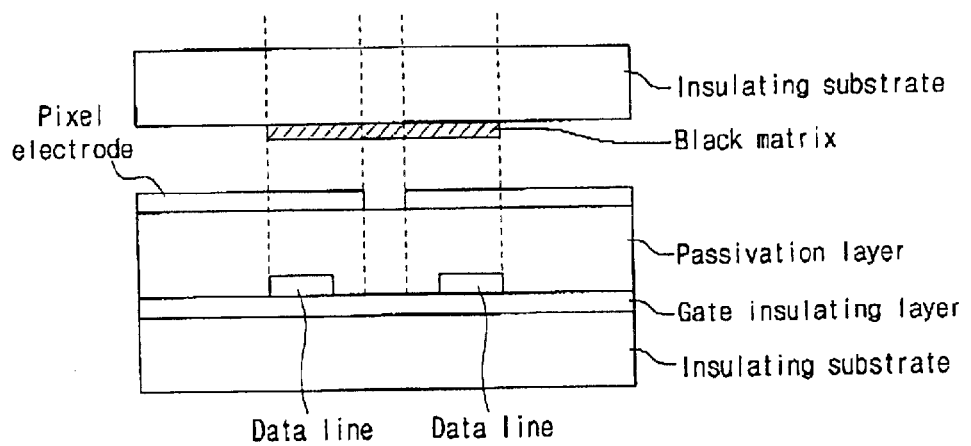
FIG. 23 is a schematic sectional view of an LCD according to the fourth embodiment of the present invention.

FIG. 23 schematically illustrates the section of the LCD according to the fourth embodiment of the present invention.

As shown in FIG. 23, the pixel electrode completely overlaps the dual data lines. A thick passivation layer is formed between the data line and the pixel electrode to prevent signal intervention due to the overlapping thereof.

As the data line completely overlaps the pixel electrode, misalignment during the photolithography process of the partitioned light exposing does not result in the difference in the parasitic capacitance between the data line and the pixel electrode. As the dual data lines prevent light leakage due to the signal intervention between the neighboring pixel electrodes, the width of the black matrix of the upper panel can be reduced.

The method of manufacturing a "lower panel" according to the fourth embodiment will be now described with reference to FIGS. 24A to 27B as well as FIGS. 20 and 21.

Figure 24A:
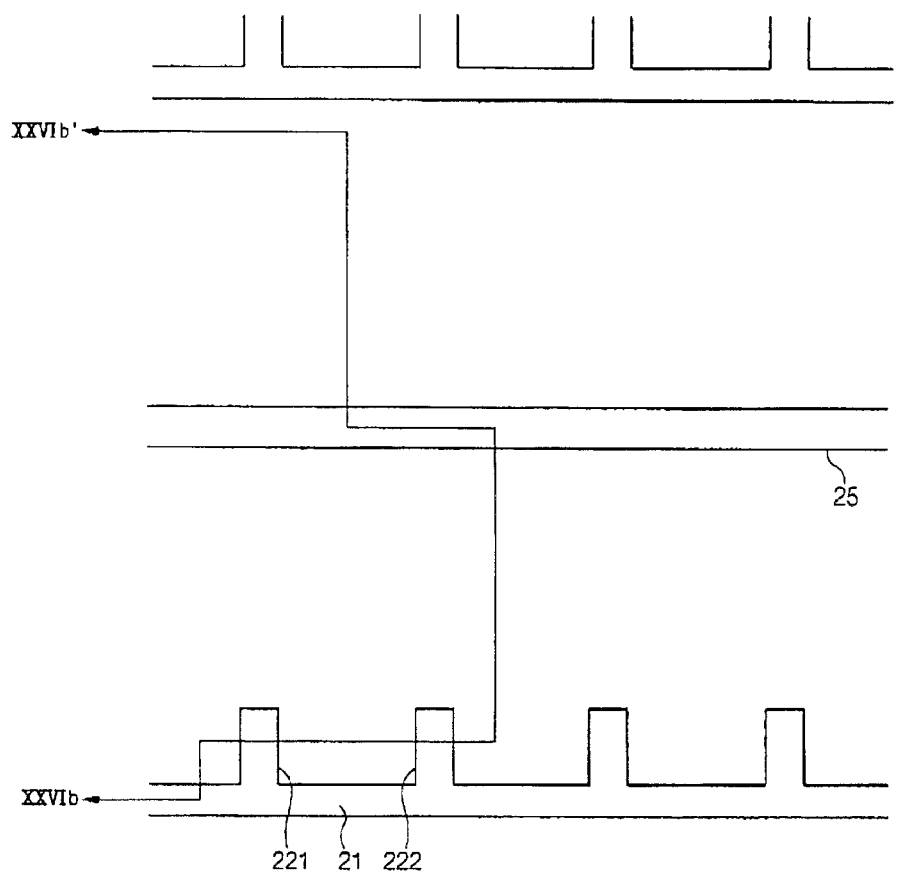
FIG. 24A is a layout view illustrating the first step of manufacturing a TFT array panel according to an embodiment of the present invention.
Figure 24B:
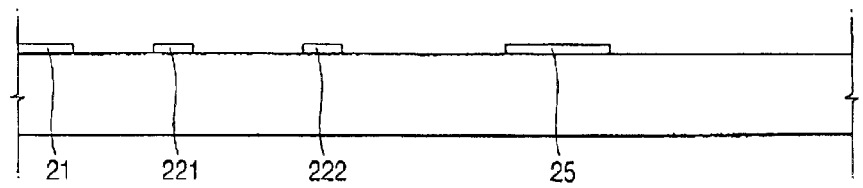
FIG. 24B is a sectional view taken along the line XXIVb–XXIVb' of FIG. 24A.

As shown in FIGS. 24A and 24B, a metallic or conductive material for a gate wire with a thickness of 1,000–3,000 Å is deposited on an insulating substrate 10 by sputtering, etc., and patterned by photoetch using a mask to form a gate wire and storage electrode lines 25. The gate wire includes gate lines 21, and first and second gate electrodes 221 and 222.

Figure 25A:
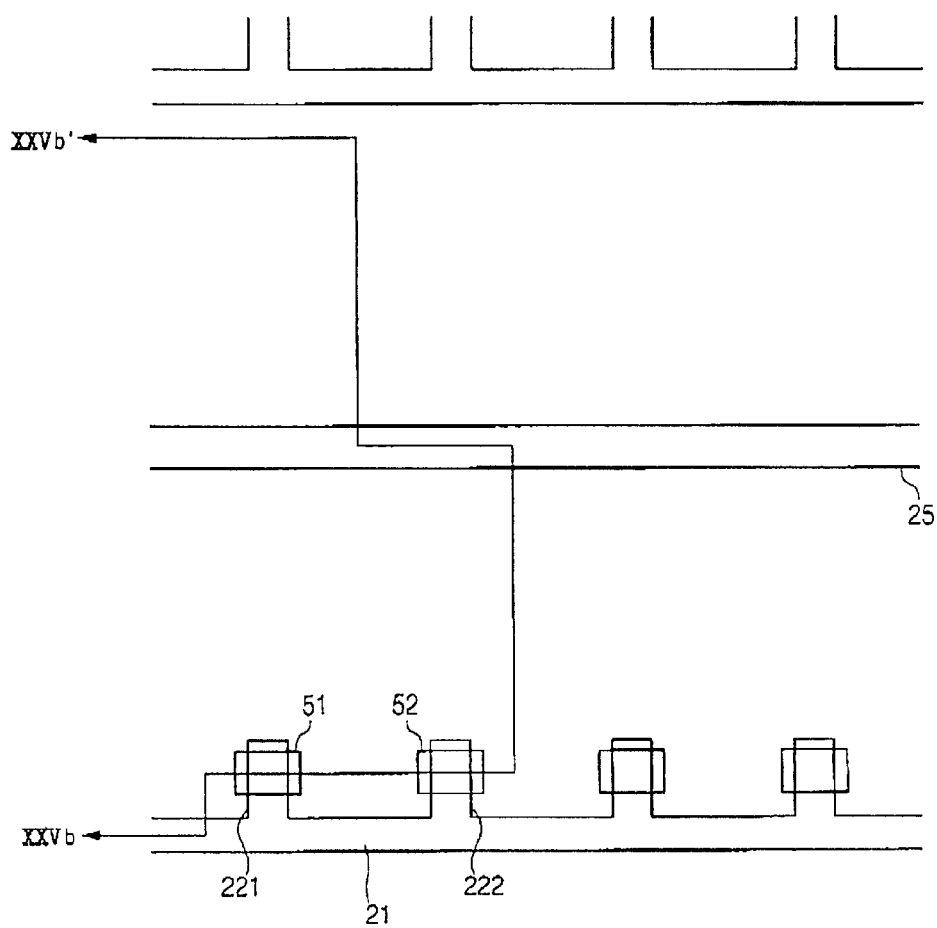
FIG. 25A is a layout view illustrating the step following the step illustrated in FIG. 24A.
Figure 25B:
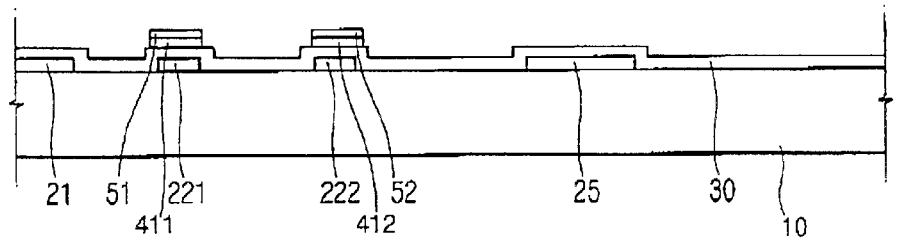
FIG. 25B is a sectional view taken along the line XXVb–XXVb' of FIG. 25A.

Thereafter, as shown in FIGS. 25A and 25B, a gate insulating layer 30, an amorphous silicon layer and an n type impurity-doped amorphous silicon layer are sequentially deposited by chemical vapor deposition ("CVD"), etc., such that they bear a thickness of 1,500–5,000 Å, a thickness of 500–1,500 Å and a thickness of 300–600 Å, respectively. The upper two layers are patterned by photoetch using a mask to form semiconductor layers 41 and 42, and ohmic contact layers 51 and 52.

Figure 26A:
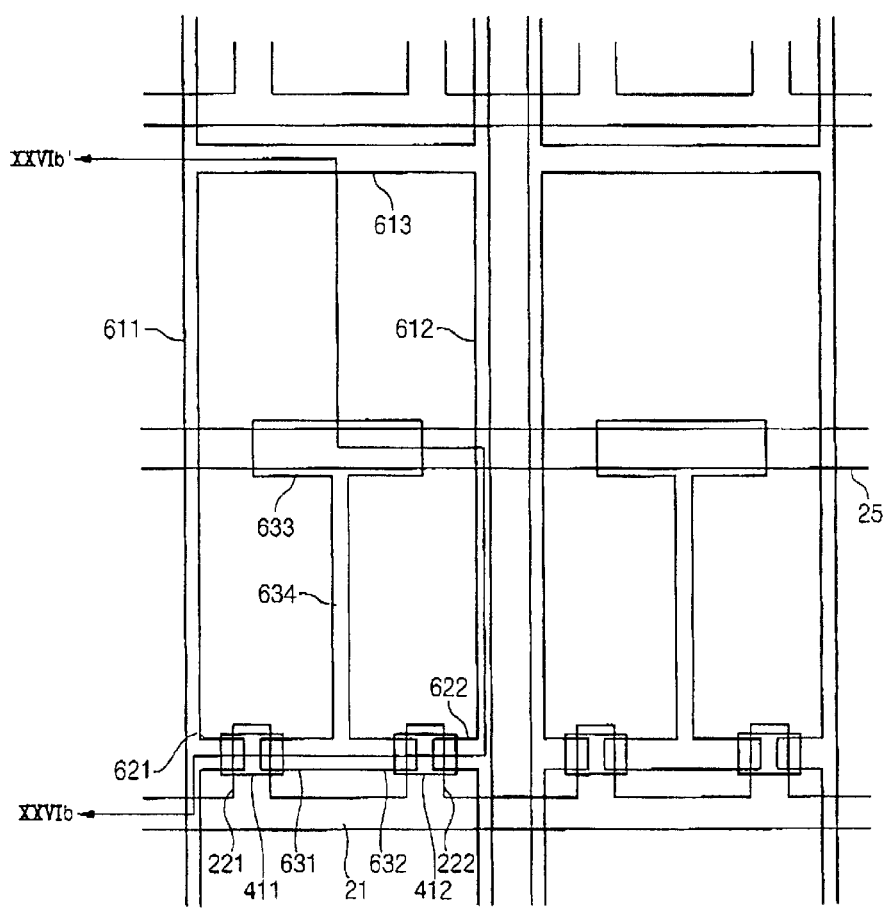
FIG. 26A is a layout view illustrating the step following the step illustrated in FIG. 25A.
Figure 26B:
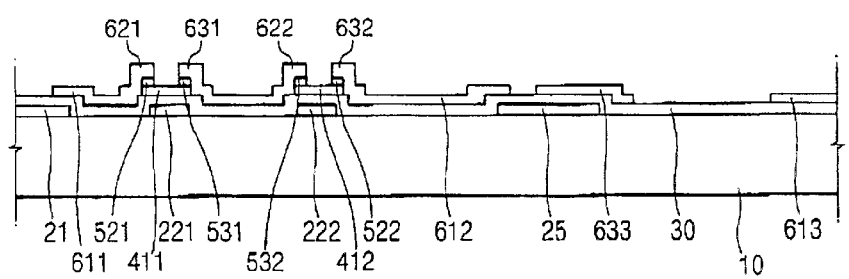
FIG. 26B is a sectional view taken along the line XXVIb–XXVIb' of FIG. 26A.

As shown in FIGS. 26A and 26B, a metallic or conductive material for a data wire is deposited by sputtering, etc., such that it bears a thickness of 1,500–3,000 Å, and patterned by photoetch using a mask to form a data wire. The data wire includes first and second data lines 611 and 612, a data line connector 613, first and second source electrodes 621 and 622, first and second drain electrodes 631 and 632, storage capacitor conductive patterns 633, and conductor pattern connectors 634. A portion of the ohmic contact layer 51 exposed between the first source electrodes 621 and the first drain electrodes 631 is removed such that the ohmic contact layer 51 is separated into two portions 521 and 531. A portion of the ohmic contact layer 52 exposed between the second source electrodes 622 and the second drain electrodes 632 is removed such that the ohmic contact layer 52 is separated into two portions 522 and 532.

Figure 27A:
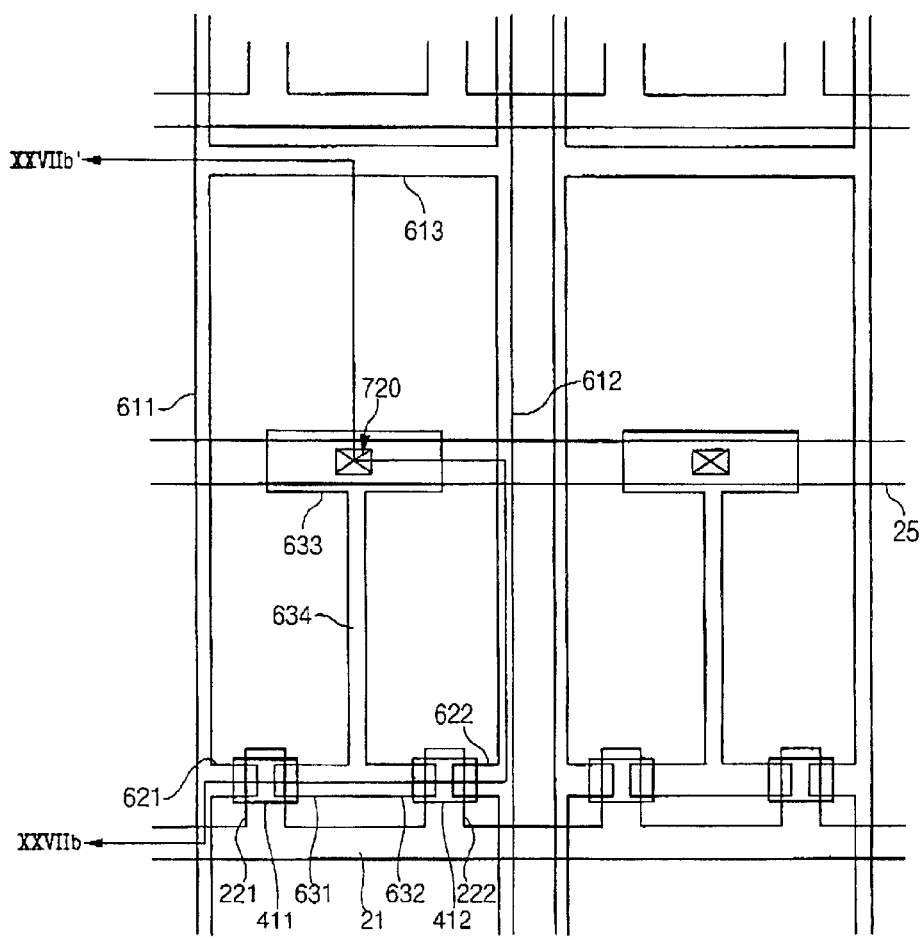
FIG. 27A is a layout view illustrating the step following the step illustrated in FIG. 26A.
Figure 27B:
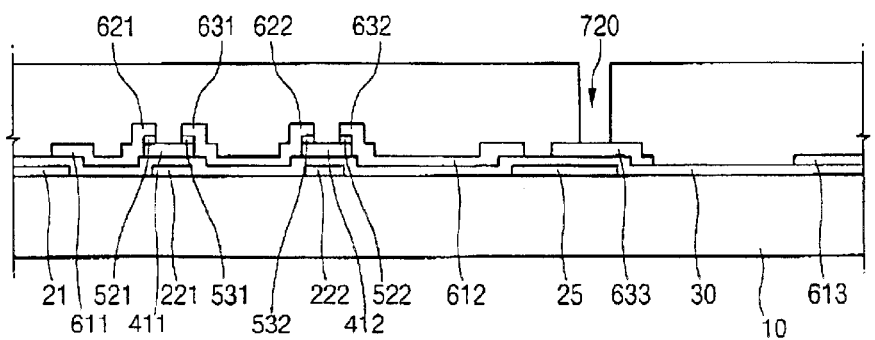
FIG. 27B is a sectional view taken along the line XXVIb–XXVIIb' of FIG. 27A.

As shown in FIGS. 27A and 27B, a passivation layer 70 with a thickness equal to or thicker than 30,000 Å is formed by depositing silicon nitride is deposited on the substrate 10 by CVD or by spin-coating an organic insulating material. The passivation layer 70 is patterned by photoetch using a mask to form a contact hole 720.

Thereafter, as shown in FIGS. 20 and 21, a transparent conductive material such as ITO and IZO is deposited by sputtering, etc., such that it bears a thickness of 400–500 Å, and patterned by photoetch using a mask to form pixel electrodes 80.

Protrusions 811 to 814 are formed simultaneously in the step of forming the pixel electrode 80 using a mask having partially-differentiated light transmittance. This will be described.

In order to adjust the light transmittance, a mask having a slit or lattice pattern or a semitransparent film may be used. It is preferable that the width of the pattern between the slits or the distance between the patterns, i.e., the width of the slits is established to be smaller than the light resolution of the light exposer. When using the semitransparent film, thin films with different light transmittance or with different thickness may be used.

Alternatively, an aperture pattern may be formed at the pixel electrode 80 instead of the protrusion pattern in the TFT array panel for an LCD according to the fourth embodiment of the present invention. In this case, the patterning is made by photoetch using a mask.

The embodiment of the present invention uses five photoetch steps to manufacture a TFT array panel. Alternatively, a TFT array panel may be manufactured by performing four photoetch steps. This will be now described as another embodiment of the present invention with reference to FIGS. 28 to 34B.

As shown in FIGS. 24A and 11B, a metallic or conductive material for a gate wire is deposited on an insulating substrate 10, and patterned by a first photoetch step to form a gate wire and storage electrode lines 25. The gate wire includes gate lines 21, and first and second gate electrodes 221 and 222.

Figure 28:
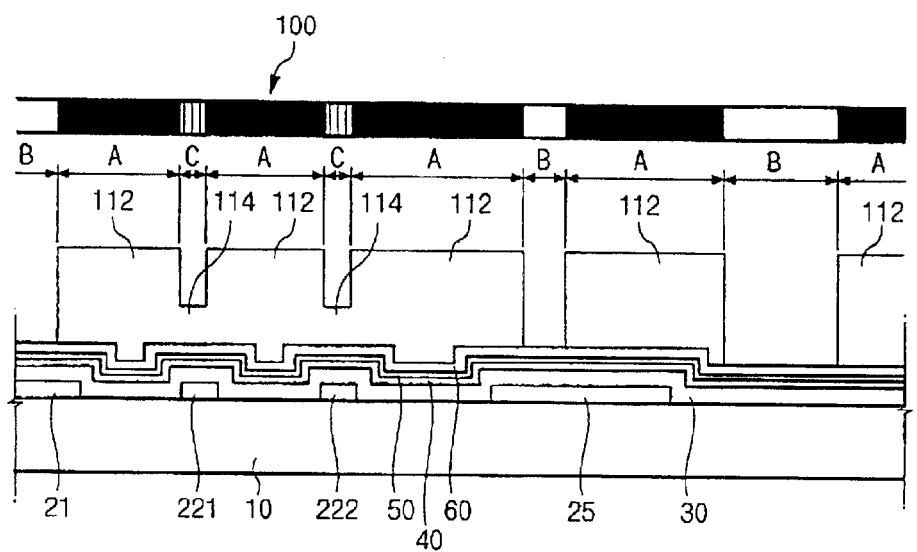
FIGS. 28 to 31 are sectional views sequentially illustrating the steps following the step illustrated in FIG. 24B according to another embodiment of the present invention.

Thereafter, as shown in FIG. 28, a gate insulating layer 30, an amorphous silicon layer 40, a doped amorphous silicon layer 50 and a conductive layer 60 for a data wire are sequentially deposited.

In a second photolithography step, after a photoresist film 110 with a thickness of 1–2 μm is coated and exposed to light through a mask 100 having a position-dependent light transmittance, the photoresist film 110 is developed to form a photoresist pattern 112 and 114. A first portion 112 of the photoresist pattern is placed in a channel area C of first and second TFTs, located between a first source electrode 621 and a first drain electrode 631 as well as between a second source electrode 622 and a second drain electrode 632. A second portion 114 of the photoresist pattern is placed in a data wire area A, where a data wire 611–613, 621, 622 and 631–634 will be formed. The first portion 114 has a thickness smaller than that of the second portion 112. The photoresist film in the remaining area B is all removed.

The position-dependent thickness of the photoresist film is obtained by several techniques. In order to adjust the light transmittance at the C area, a slit or lattice pattern is provided or a semitransparent film may be used.

It is preferable that the width of the pattern between the slits or the distance between the patterns, i.e., the width of the slits is established to be smaller than the light resolution of the light exposer. When using the semitransparent film, thin films with different light transmittance or with different thickness may be used.

The first portion 114 of the photoresist film may be formed using a reflowable photoresist film. After the reflowable photoresist film is exposed to light through a usual mask with a transparent portion and an opaque portion, and developed, the photoresist film is reflowed such that a portion of the film flows onto an area with no photoresist.

Thereafter, the photoresist pattern and the underlying layers including the conductive layer 60, the doped amorphous silicon layer 50 and the amorphous silicon layer 40 are etched such that the data wire and the underlying layers are left in the data wire area A, only the amorphous silicon layer is left in the channel area C, and the three layers 60, 50 and 40 are removed to expose the gate insulating layer 30 in the remaining area B.

Figure 29:
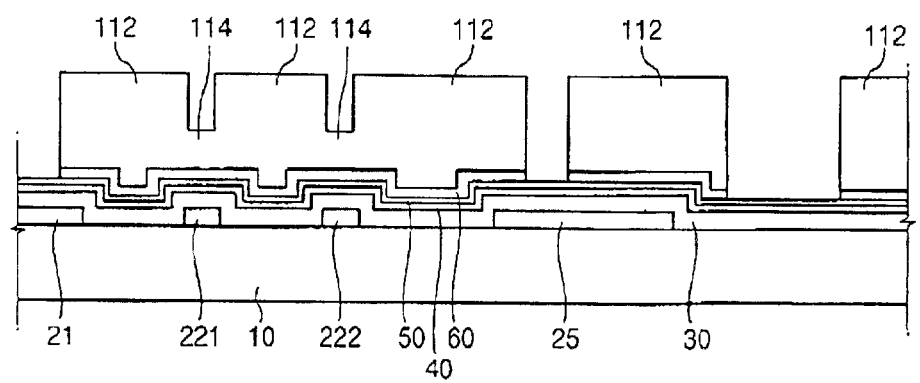

For this purpose, as shown in FIG. 29, an exposed portion of the conductive layer 60 in the area B is removed to expose the underlying doped amorphous silicon layer 50. This process is preferably performed in condition that the photoresist pattern 112 and 114 is not nearly etched.

Figure 30:
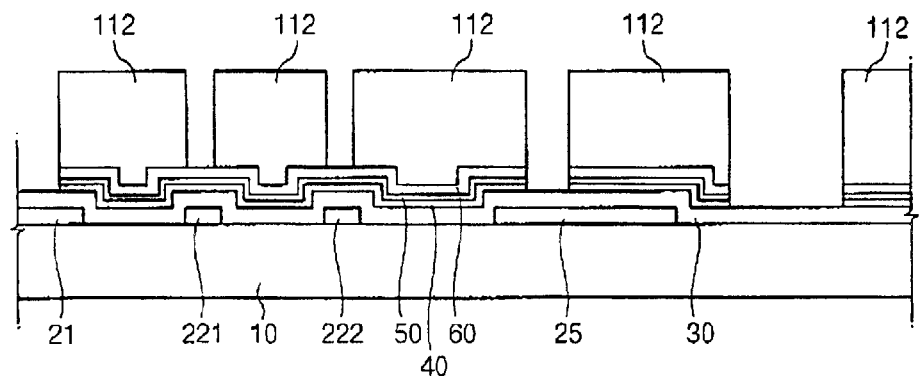

As shown in FIG. 30, portions of the doped amorphous silicon layer 50 and the underlying amorphous silicon layer 40 in the area B are simultaneously removed together with the first portion 114 by way of dry etching. The etching is preferably performed in condition that the photoresist pattern 112 and 114, the doped amorphous silicon layer 50 and the amorphous silicon layer 40 are simultaneously etched, but the gate insulating layer 30 is not etched.

Consequently, the first portion 114 in the channel area C is removed to expose the conductive layer 60. The doped amorphous silicon layer 50 and the amorphous silicon layer 40 in the area B are removed to expose the underlying gate insulating layer 30. The second portion 112 in the data wire area A is also etched to have reduced thickness.

The photoresist residue on the surface of the conductive layer 60 in the channel area C is removed by ashing.

Figure 31:
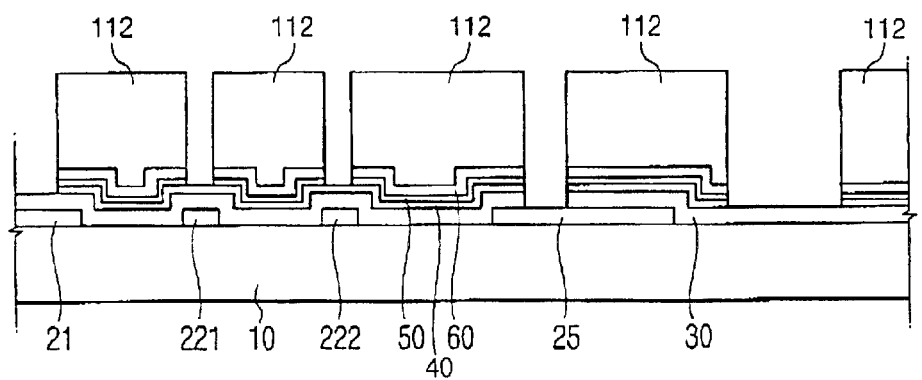

As shown in FIG. 31, portions of the conductive layer 60 and the underlying doped amorphous silicon layer 50 in the channel area C are removed by etching.

Figure 32A:
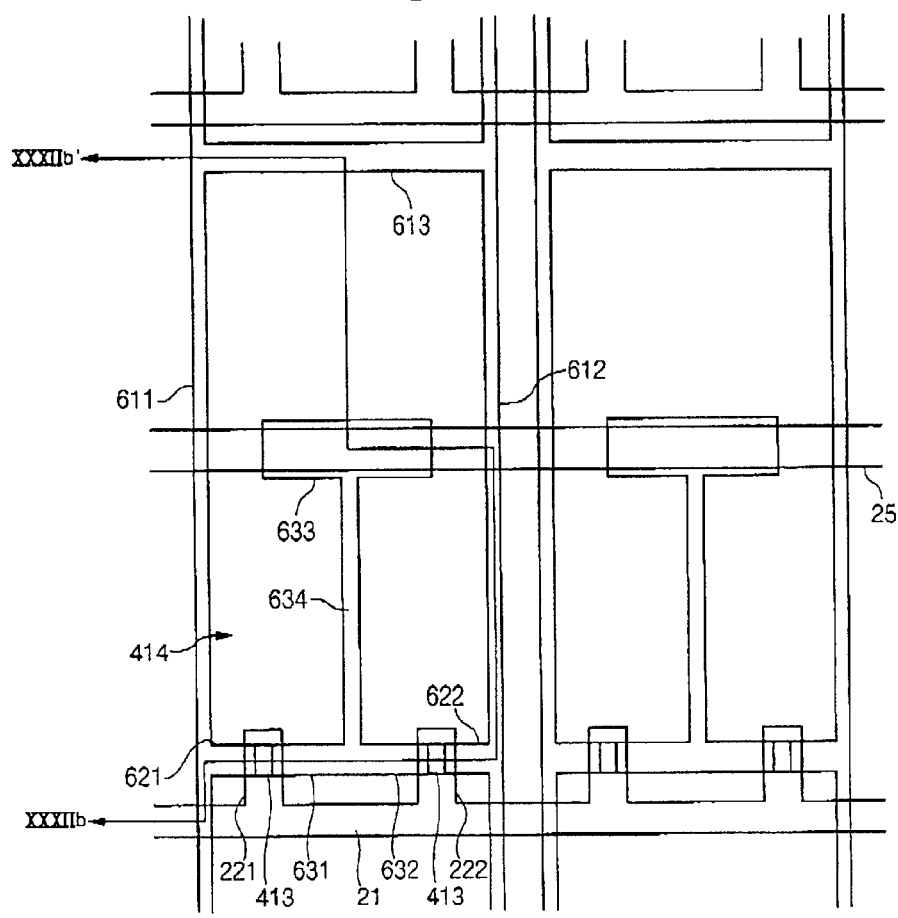
FIG. 32A is a layout view illustrating the step following the step illustrated in FIG. 31.
Figure 32B:
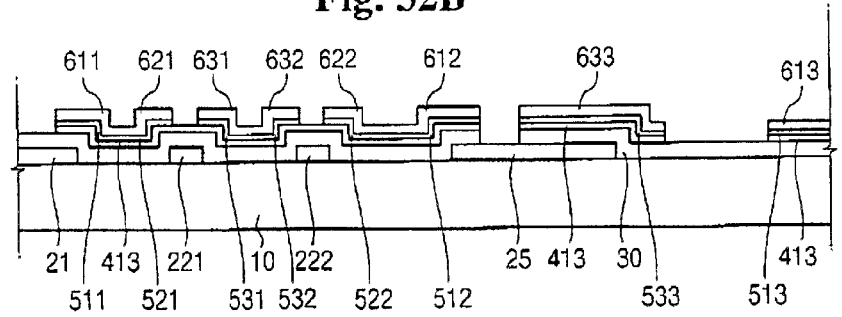
FIG. 32B is a sectional view taken along the line XXXIIb–XXXIIb' of FIG. 32A.

Finally, the second portion 112 in the data wire area A is removed. As shown in FIGS. 32A and 32B, the first source electrode 621 and the first drain electrode 631 as well as the second source electrode 622 and the second drain electrode 632 are separated from each other so that the data wire 611–613, 621, 622 and 631–634 and the underlying ohmic contact layers 511, 521, 531, 532, 522, 512 and 513 and semiconductor layer 413 are completed.

Figure 33A:
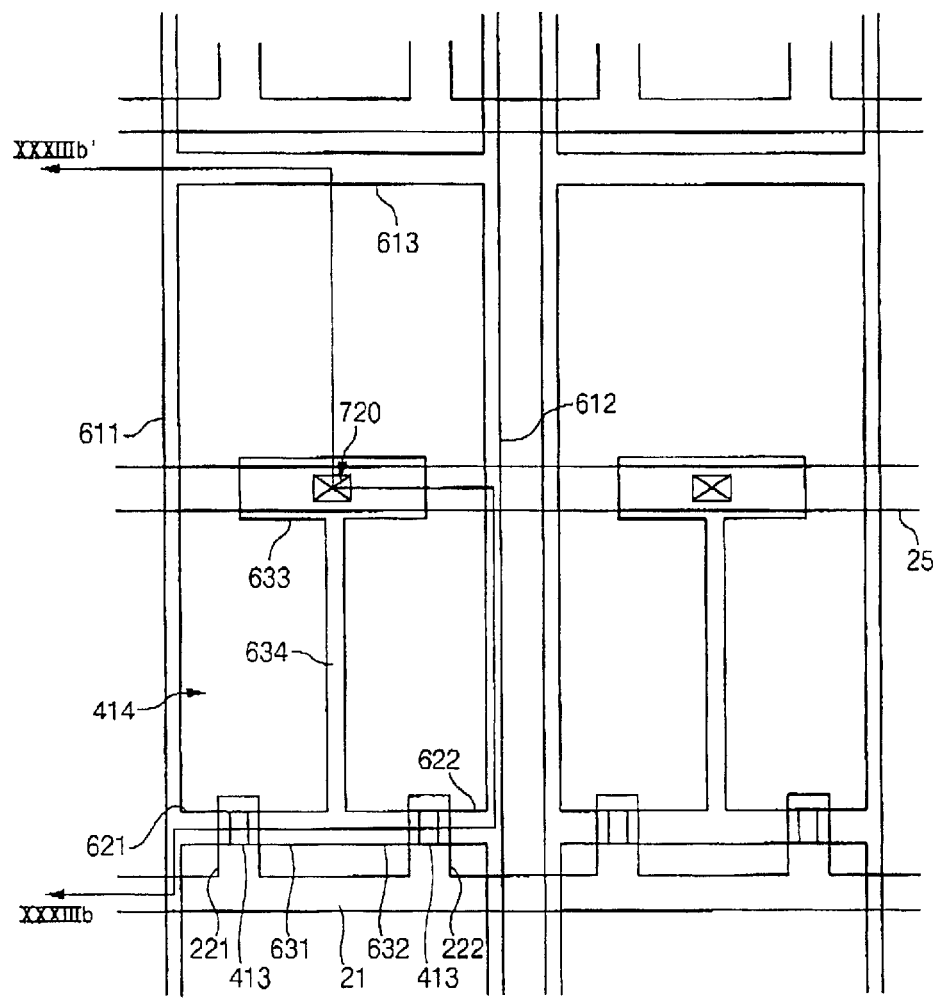
FIG. 33A is a layout view illustrating the step following the step illustrated in FIG. 32A.
Figure 33B:
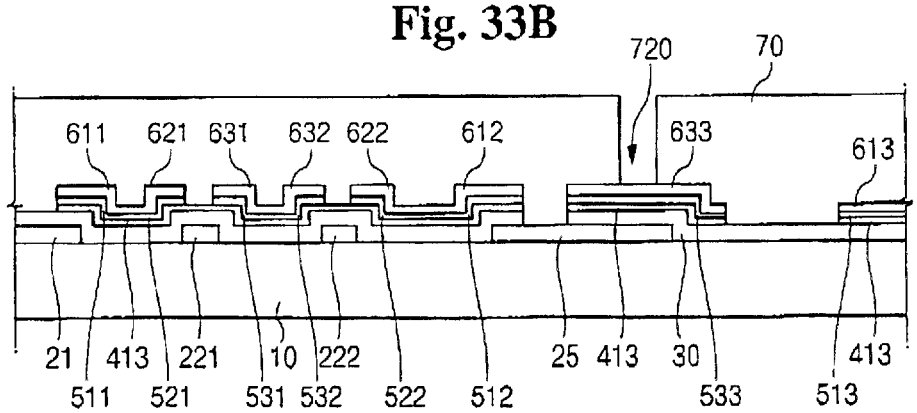
FIG. 33B is a sectional view taken along the line XXXIIIb–XXXIIIb' of FIG. 33A.

After the data wire 611–613, 621, 622 and 631–634 is completed, as shown in FIGS. 33A and 20B, a passivation layer 70 with a thickness of 3 μm or more is formed by depositing silicon nitride as in the previous embodiment, and patterned through a third photoetch step to form a contact hole 720.

Figure 34A:
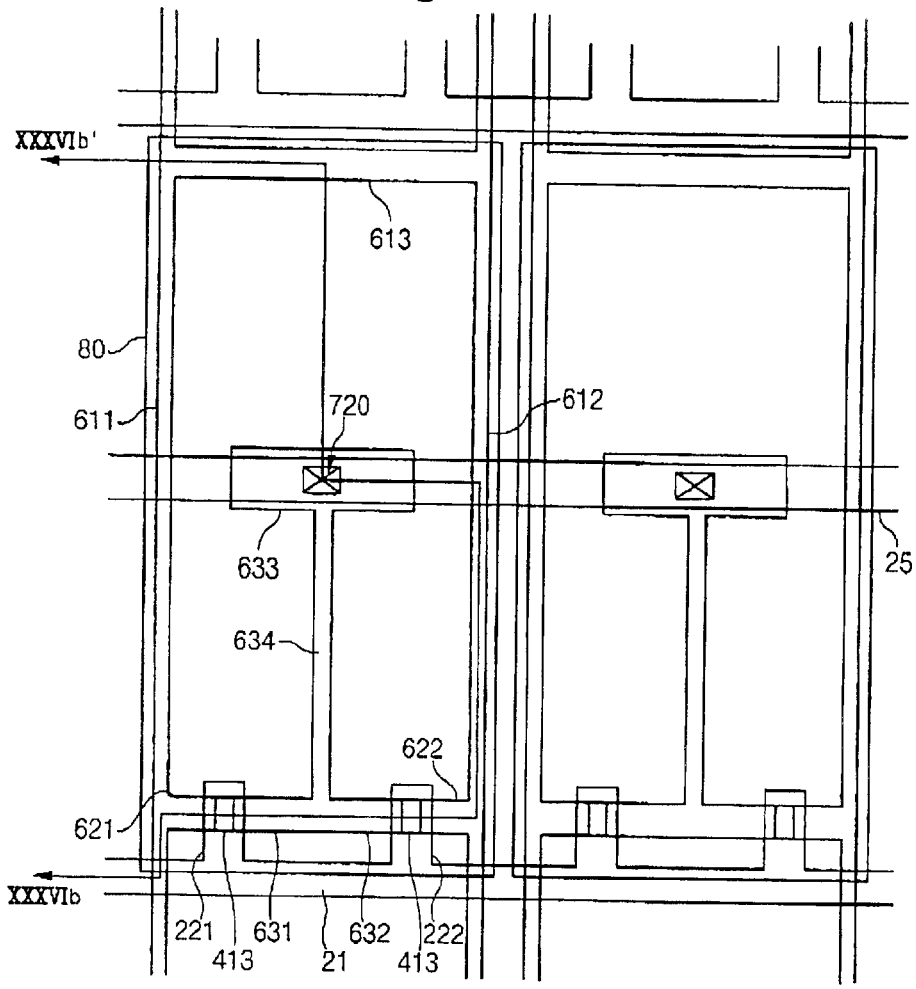
FIG. 34A is a layout view illustrating the step following the step illustrated in FIG. 33A.
Figure 34B:
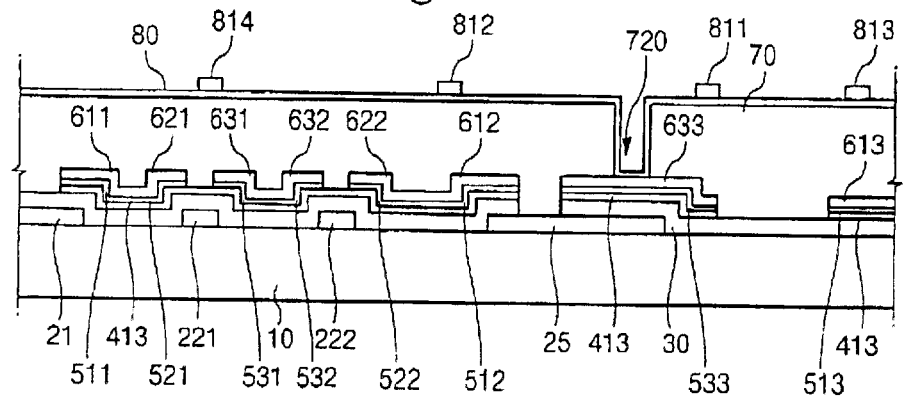
FIG. 34B is a sectional view taken along the line XXXIVb–XXXIVb' of FIG. 34A.

Finally, as shown in FIGS. 34A and 34B, a transparent conductive material such as ITO and IZO is deposited, and patterned by a fourth photoetch step to form pixel electrodes 80, as in the previous embodiment.

The another embodiment of the present invention for a TFT array panel simplifies the manufacturing process by forming the data wire 611–613, 621, 622 and 631–634 and the underlying ohmic contact layers 511, 521, 531, 532, 522, 512 and 513 and semiconductor layer 413 by one photolithography step, as well as has the same advantage as the previous embodiment.

As described above, the present invention provides the data line at opposite sides of the pixel area so that variation in the pixel voltage due to the parasitic capacitance between the partitioned areas with different degree of misalignment is reduced. In addition, two TFTs are provided in each pixel area so that the parasitic capacitance between the gate and the drain electrodes in two respective partitioned areas with left-biased and right-biased misalignment is kept to be constant. In this way, the pixel voltage variation between the two partitioned areas is reduced to prevent non-uniformity in the brightness. The thick passivation layer is provided and the pixel electrode overlaps the data line, thereby enhancing the aperture ratio.

What is claimed is:

1. A thin film transistor ("TFT") array panel for a liquid crystal display ("LCD") comprising:
a gate wire formed on an insulating substrate, the gate wire including gate lines, and first and second gate electrodes connected to the gate lines and spaced apart from each other by a predetermined distance;
a gate insulating layer covering the gate wire;
first and second semiconductor layers formed on the gate insulating layer opposite the first and the second gate electrodes, respectively;
a data wire including first and second data lines intersecting the gate lines to define pixel areas and spaced apart tram each other by a predetermined distance, first and second source electrodes which are respective parts of the first and the second data lines, and first and second drain electrodes respectively facing the first and the second source electrodes;
a passivation layer with first and second contact holes respectively exposing the first and the second drain electrodes; and
a pixel electrode connected to the first and the second drain electrodes,
wherein the pixel electrode overlaps the first and the second data lines to cover an entire width of the first and the second data lines.

2. The TFT array panel of claim 1 wherein the first and the second data lines are applied with the same signal.

3. The TFT array panel of claim 1 wherein the data wire further includes data line connectors, respectively formed at the upper and the lower half parts of the pixel area, to interconnect the first and the second data lines.

4. The TFT array panel of claim 1 wherein the first and the second semiconductor layers and the data wire have the same planar shape except for areas between the first source electrode and the first drain electrode and between the second source electrode and the second drain electrode.

5. The TFT array panel of claim 1 further comprising ohmic contact layers formed between the first and second semiconductor layers and the data wire.

6. The TFT array panel of claim 5 wherein the ohmic contact layers and the data wire have the same planar shape.

7. The TFT array panel of claim 1 wherein the gate wire further includes gate pads for applying signals to the gate lines, the data wire further has data pads for applying signals to the data lines, and the passivation layer further has third and fourth contact holes respectively exposing the gate and the data pads, and wherein the TFT array panel further comprises subsidiary gate and data pads formed of the same layer as the pixel electrode and connected to the gate and the data pads through the third and the fourth contact holes, respectively.

8. A liquid crystal display ("LCD") comprising:
a first insulating substrate;
a gate wire formed on the first insulating substrate, the gate wire including gate lines, and first and second gate electrodes connected to the gate lines and spaced apart from each other by a predetermined distance;
a gate insulating layer covering the gate wire;
first and second semiconductor layers formed on the gate insulating layer opposite the first and the second gate electrodes, respectively;
a data wire including first and second data lines intersecting the gate lines to define pixel areas and spaced apart from each other by a predetermined distance, first and second source electrodes which are respective parts of the first and the second data lines, and first and second drain electrodes respectively facing the first and the second source electrodes;
a passivation layer with first and second contact holes respectively exposing the first and the second drain electrodes;
a pixel electrode connected to the first and the second drain electrodes;
a first domain partitioning member formed on the first insulating substrate;
a second insulating substrate opposite the first insulating substrate;
a color filter formed on the second insulating substrate;
a common electrode formed on the color filter; and
a second domain partitioning member formed on the second insulating substrates
wherein the pixel electrode overlaps the data wire having the first and the second data lines at least in oart and the passivation layer placed between the data wire and the pixel electrode has a thickness of 3 μm or more.

9. The LCD of claim 8 wherein the first and the second domain partitioning members comprise a protrusion pattern.

10. The LCD of claim 8 wherein the first and the second domain partitioning members comprise an opening pattern.

11. The LCD of claim 8 wherein one of the first and the second domain partitioning members comprises a protrusion pattern, and the other comprises an opening pattern.

12. A thin film transistor ("TFT") array panel comprising:
a gate wire formed on an insulating substrate, the gate wire including gate lines, and first and second gate electrodes connected to the gate lines and spaced apart from each other by a predetermined distance;
a gate insulating layer covering the gate wire;
first and second semiconductor layers formed on the gate insulating layer opposite the first and the second gate electrodes, respectively;
a data wire including first and second data lines intersecting the gate lines to define pixel areas and spaced apart from each other by a predetermined distance, first and second source electrodes which are respective parts of the first and the second data lines, and first and second drain electrodes respectively facing the first and the second source electrodes;
a passivation layer with at least one contact hole for electrically connecting the first and the second drain electrodes to the pixel electrode; and
a pixel electrode electrically connected to the first and the second drain electrodes,
wherein the pixel electrode overlaps the data wire having the first and the second data lines at least in part and the passivation aver placed between the data wire and the pixel electrode has a thickness of 3 μm or more.

13. The TFT array panel of claim 12 wherein the first and the second drain electrodes are connected to each other.

14. The TFT array panel of claim 12 wherein the data wire further includes data line connectors, respectively formed at the upper and the lower half parts of the pixel area, to interconnect the first and the second data lines.

15. The TFT array panel of claim 12 further comprising a storage electrode line formed of the same layer as the gate lines and parallel to the gate lines.

16. The TFT array panel of claim 15 further comprising storage capacitor conductive patterns overlapped with the storage electrode lines.

17. The TFT array panel of claim 16 further comprising a conductor pattern connector connecting the first and the second drain electrodes to the storage capacitor conductive pattern.

18. The TFT array panel of claim 16 wherein the at least one contact hole is placed on the storage capacitor conductive pattern.

19. The TFT array panel of claim 12 wherein the first and second semiconductor layers and the data wire have the same planar shape except for areas between the first source electrode and the first drain electrode and between the second source electrode and the second drain electrode.

* * * * *